(12) United States Patent
Mitomo et al.

(10) Patent No.: US 11,602,889 B2
(45) Date of Patent: Mar. 14, 2023

(54) STEREOLITHOGRAPHY APPARATUS AND LIGHT EMISSION CONTROL METHOD

(71) Applicant: SONY CORPORATION, Tokyo (JP)

(72) Inventors: Jugo Mitomo, Kanagawa (JP); Kei Satou, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 30 days.

(21) Appl. No.: 16/639,247

(22) PCT Filed: Aug. 8, 2018

(86) PCT No.: PCT/JP2018/029722
§ 371 (c)(1),
(2) Date: Feb. 14, 2020

(87) PCT Pub. No.: WO2019/039276
PCT Pub. Date: Feb. 28, 2019

(65) Prior Publication Data
US 2020/0238605 A1    Jul. 30, 2020

(30) Foreign Application Priority Data

Aug. 24, 2017 (JP) .............................. JP2017-160822

(51) Int. Cl.
  *B29C 64/135*    (2017.01)
  *G03F 7/20*    (2006.01)
  (Continued)

(52) U.S. Cl.
  CPC .......... *B29C 64/135* (2017.08); *B29C 64/386* (2017.08); *B29C 64/393* (2017.08);
  (Continued)

(58) Field of Classification Search
  CPC ................ B29C 64/386; B29C 64/393; B29C 64/129; B29C 64/135; B29C 64/264;
  (Continued)

(56) References Cited

U.S. PATENT DOCUMENTS

2003/0214571 A1    11/2003    Ishikawa et al.
2007/0077323 A1*    4/2007    Stonesmith ........... B29C 64/182
                                                       425/174
(Continued)

FOREIGN PATENT DOCUMENTS

AT    510306 A2    3/2012
CN    1659479 A    8/2005
(Continued)

OTHER PUBLICATIONS

International Search Report and Written Opinion of PCT Application No. PCT/JP2018/029722, dated Sep. 25, 2018, 09 pages of ISRWO.

(Continued)

*Primary Examiner* — Philip C Tucker
*Assistant Examiner* — Jimmy R Smith, Jr.
(74) *Attorney, Agent, or Firm* — Chip Law Group

(57) ABSTRACT

A stereolithography apparatus according to an embodiment of the present technology includes a light source unit, a photo-detector, and a control unit. The light source unit includes a plurality of light-emitting elements that emits light for curing a photo-curing resin. The photo-detector detects the light emitted from the light source unit. The control unit generates an amount-of-light profile indicating an amount-of-light distribution of the light on the basis of the light detected by the photo-detector and controls light emission of the plurality of light-emitting elements on the basis of the amount-of-light profile.

11 Claims, 28 Drawing Sheets

(51) Int. Cl.
  *B29C 64/386* (2017.01)
  *B33Y 30/00* (2015.01)
  *B29C 64/277* (2017.01)
  *B29C 64/393* (2017.01)
  *B33Y 10/00* (2015.01)

(52) U.S. Cl.
  CPC ........ *G03F 7/70416* (2013.01); *B29C 64/277* (2017.08); *B33Y 10/00* (2014.12); *B33Y 30/00* (2014.12)

(58) Field of Classification Search
  CPC ... B29C 64/268; B29C 64/273; B29C 64/277; B29C 64/282; B29C 64/286; B29C 64/291; B29C 71/04; B33Y 50/02; B33Y 30/00; G03F 7/70416
  USPC .............................................. 425/174, 174.4
  See application file for complete search history.

(56) References Cited

U.S. PATENT DOCUMENTS

| | | | |
|---|---|---|---|
| 2009/0267269 A1 | 10/2009 | Hong et al. | |
| 2010/0098835 A1 | 4/2010 | Wang et al. | |
| 2010/0125356 A1 | 5/2010 | Alexander et al. | |
| 2012/0002185 A1* | 1/2012 | Deguenther | G03F 7/70591 355/67 |
| 2012/0007288 A1* | 1/2012 | Wang | B29C 64/129 264/401 |
| 2012/0045617 A1* | 2/2012 | Yasukochi | B29C 64/218 428/156 |
| 2017/0304946 A1 | 10/2017 | Shibazaki | |

FOREIGN PATENT DOCUMENTS

| | | |
|---|---|---|
| CN | 101009218 A | 8/2007 |
| CN | 102186653 A | 9/2011 |
| CN | 102349026 A | 2/2012 |
| CN | 102371680 A | 3/2012 |
| CN | 107000059 A | 8/2017 |
| CN | 107085352 A | 8/2017 |
| DE | 19929199 A1 | 1/2001 |
| EP | 3219412 A1 | 9/2017 |
| EP | 2344323 B1 | 4/2018 |
| JP | 04-138245 A | 5/1992 |
| JP | 2003-340923 A | 12/2003 |
| JP | 2007-090619 A | 4/2007 |
| JP | 2007200953 | 8/2007 |
| JP | 2010516498 | 5/2010 |
| JP | 2012-040757 A | 3/2012 |
| JP | 2012-506326 A | 3/2012 |
| JP | 2012520554 | 9/2012 |
| JP | 2013067016 A | 4/2013 |
| KR | 10-2005-0003356 A | 1/2005 |
| KR | 10-2017-0084195 A | 7/2017 |
| TW | 200405032 A | 4/2004 |
| TW | 201036804 A | 10/2010 |
| TW | 201633027 A | 9/2016 |
| WO | 2003/085457 A1 | 10/2003 |
| WO | 2010/048082 A2 | 4/2010 |
| WO | 2016/075801 A1 | 5/2016 |

OTHER PUBLICATIONS

Office action for CN Application No. 201880051054.7 dated Jun. 24, 2021, 76 pages of office action and 11 pages of translation.

Office Action for Taiwan Patent Application No. 107123776 dated Dec. 28, 2021.

Japanese Office Action issued in Japanese Application No. 2019-538056, dated May 17, 2022.

Japanese Notice of Reasons for Refusal issued in Japanese Application No. 2019-538056, dated Dec. 6, 2022.

Office Action for German Patent Application Serial No. 112018004759.8, dated Jan. 5, 2023.

* cited by examiner

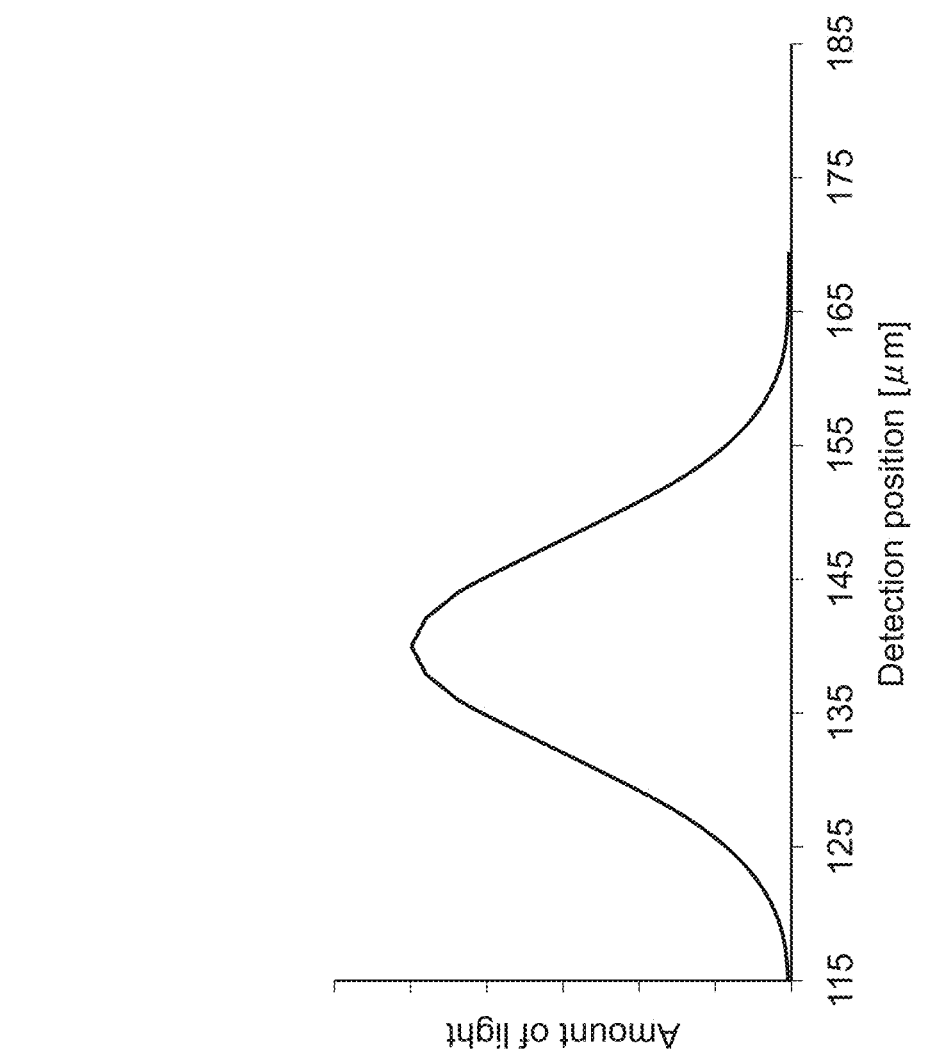
FIG.16
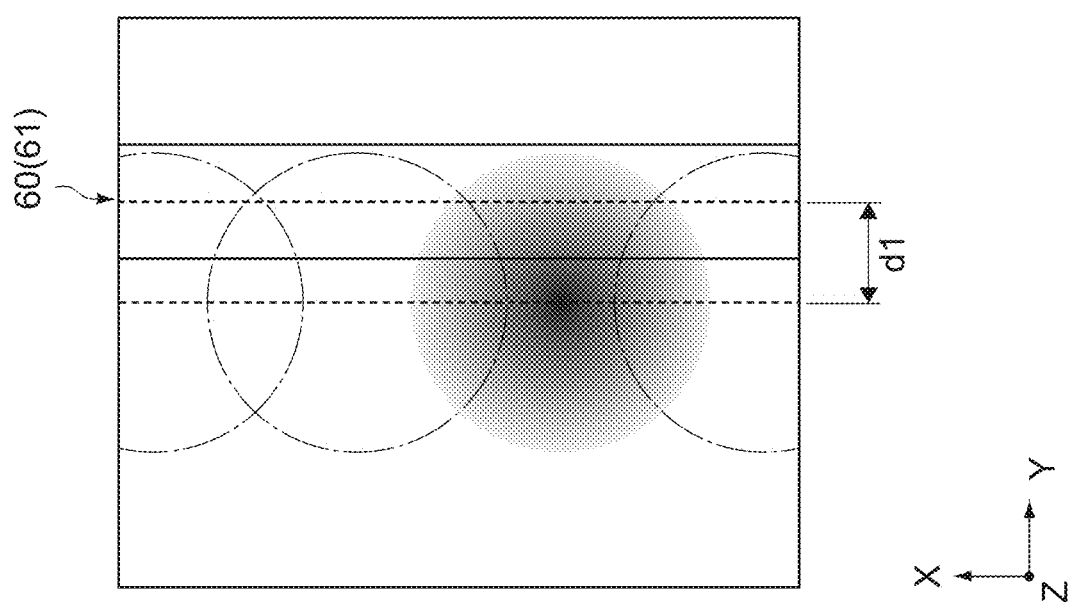

STEREOLITHOGRAPHY APPARATUS AND LIGHT EMISSION CONTROL METHOD

CROSS REFERENCE TO RELATED APPLICATIONS

This application is a U.S. National Phase of International Patent Application No. PCT/JP2018/029722 filed on Aug. 8, 2018, which claims priority benefit of Japanese Patent Application No. JP 2017-160822 filed in the Japan Patent Office on Aug. 24, 2017. Each of the above-referenced applications is hereby incorporated herein by reference in its entirety.

TECHNICAL FIELD

The present technology relates to a technology such as a stereolithography apparatus that cures a photo-curing resin to form an object to be modeled.

BACKGROUND ART

A stereolithography apparatus that cures a photo-curing resin to thereby form an object to be modeled in a desired shape by using three-dimensional computer aided design (CAD) data is conventionally widely known (e.g., see Patent Literature 1 below).

Citation List

Patent Literature

Patent Literature 1: Japanese Patent Application Laid-open No. 2007-90619

Disclosure of Invention

Technical Problem

In the stereolithography apparatus, it is desirable to provide a technology capable of accurately controlling light emission of the light-emitting element.

In view of the above-mentioned circumstances, it is an object of the present technology to provide a technology such as a stereolithography apparatus capable of accurately controlling light emission of the light-emitting element.

Solution to Problem

A stereolithography apparatus according to an embodiment of the present technology includes a light source unit, a photo-detector, and a control unit. The light source unit includes a plurality of light-emitting elements that emits light for curing a photo-curing resin. The photo-detector detects the light emitted from the light source unit. The control unit generates an amount-of-light profile indicating an amount-of-light distribution of the light on the basis of the light detected by the photo-detector and controls light emission of the plurality of light-emitting elements on the basis of the amount-of-light profile.

With this configuration, light emission of the plurality of light-emitting elements can be accurately controlled.

In the stereolithography apparatus, the control unit may correct an amount of light of each of the plurality of light-emitting elements on the basis of the amount-of-light profile.

In the stereolithography apparatus, the control unit may correct a light-emitting timing of each of the plurality of light-emitting elements on the basis of the amount-of-light profile.

In the stereolithography apparatus, a condition of $L \leq l \leq L+D$ may be satisfied assuming that a distance between the light source unit and the photo-curing resin is a distance L, a distance between the light source unit and the photo-detector is a distance l, and an exposure depth of the light source unit with respect to the photo-curing resin is D.

In the stereolithography apparatus, the photo-detector may be capable of detecting the light in a state in which the distance l between the light source unit and the photo-detector is different.

In the stereolithography apparatus, the control unit may generate a first amount-of-light profile and a second amount-of-light profile on the basis of light respectively detected in the state in which the distance l is different, and control light emission of the plurality of light-emitting elements on the basis of the first amount-of-light profile and the second amount-of-light profile.

In the stereolithography apparatus, the control unit may correct an amount of light of each of the plurality of light-emitting elements on the basis of the first amount-of-light profile and the second amount-of-light profile.

In the stereolithography apparatus, the control unit may correct a light-emitting timing of each of the plurality of light-emitting elements on the basis of the first amount-of-light profile and the second amount-of-light profile.

In the stereolithography apparatus, the photo-detector may include a first photo detector and a second photo detector each located at the distance l different.

The stereolithography apparatus may further include a moving mechanism that moves at least one of the light source unit or the photo-detector to make the distance l different.

In the stereolithography apparatus, the control unit may generate, as the amount-of-light profile, a two-dimensional amount-of-light profile indicating a two-dimensional amount-of-light distribution of the light and control light emission of the plurality of light-emitting elements on the basis of the two-dimensional amount-of-light profile.

In the stereolithography apparatus, the control unit may correct an amount of light of each of the plurality of light-emitting elements on the basis of the two-dimensional amount-of-light profile.

In the stereolithography apparatus, the control unit may correct a light-emitting timing of each of the plurality of light-emitting elements on the basis of the two-dimensional amount-of-light profile.

A light emission control method according to an embodiment of the present technology includes: detecting light emitted from a light source unit including a plurality of light-emitting elements that emits the light for curing a photo-curing resin; generating an amount-of-light profile indicating an amount-of-light distribution of the light; and controlling light emission of the plurality of light-emitting elements on the basis of the amount-of-light profile.

A program according to an embodiment of the present technology causes a computer to execute: a step of detecting light emitted from a light source unit including a plurality of light-emitting elements that emits the light for curing a photo-curing resin; a step of generating an amount-of-light profile indicating an amount-of-light distribution of the light; and a step of controlling light emission of the plurality of light-emitting elements on the basis of the amount-of-light profile.

Advantageous Effects of Invention

As described above, in accordance with the present technology, a technology such as a stereolithography apparatus capable of accurately controlling light emission of the light-emitting element can be provided.

BRIEF DESCRIPTION OF DRAWINGS

FIG. 16 A diagram showing a state when the n-th laser element 51 is caused to emit light in a state in which the center of the light source unit is located at the position which is at the distance d1 from the center of the first photo detector.

MODE(S) FOR CARRYING OUT THE INVENTION

Hereinafter, embodiments according to the present technology will be described with reference to the drawings.

First Embodiment

<Overall Configuration of Stereolithography Apparatus 100 and Configurations of Respective Units>

Figure 1:
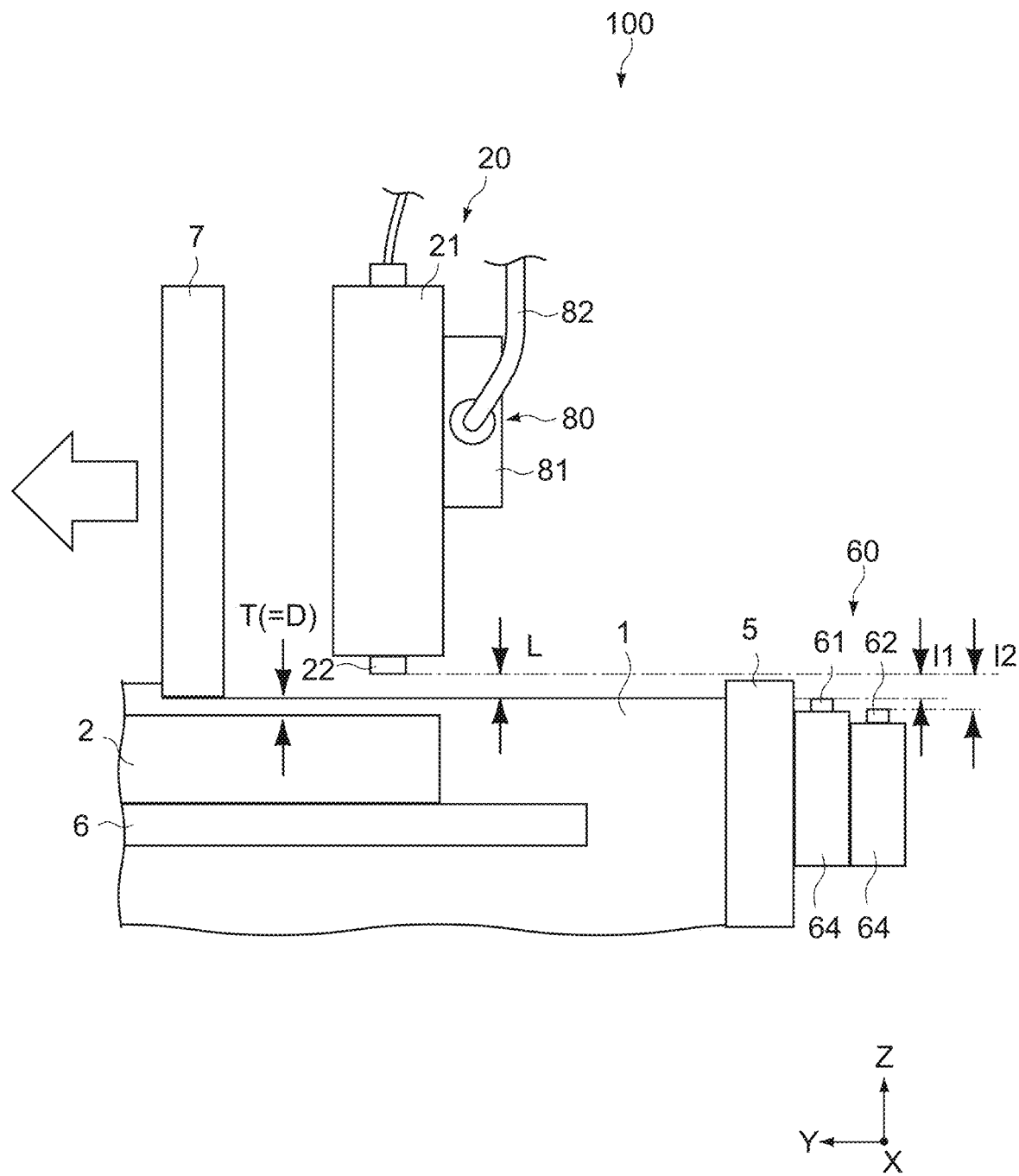
FIG. 1 A side view showing a stereolithography apparatus according to a first embodiment of the present technology.
Figure 2:
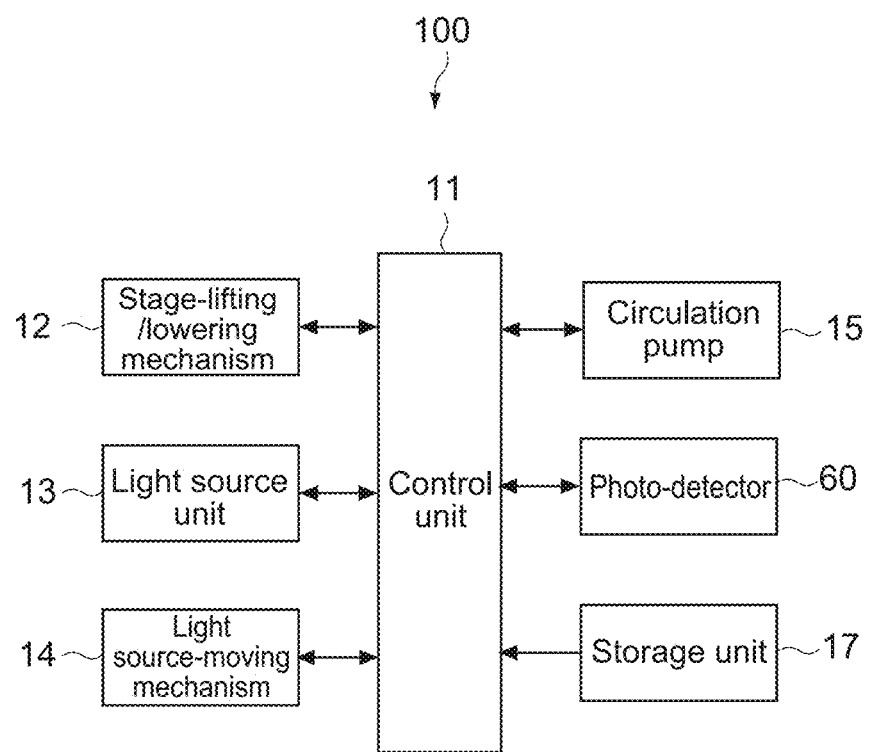
FIG. 2 An electrical block diagram showing the stereolithography apparatus.

FIG. 1 is a side view showing a stereolithography apparatus 100 according to a first embodiment of the present technology. FIG. 2 is an electrical block diagram showing the stereolithography apparatus 100. It should be noted that in each drawing described in the present specification, the stereolithography apparatus 100 and respective members of the stereolithography apparatus 100 are shown with dimensions different from the actual dimensions for the sake of easy understanding of the drawings.

As shown in those figure, the stereolithography apparatus 100 includes a resin tank 5 that stores liquid photo-curing resin 1, a stage 6 that is immerged in the photo-curing resin 1 and supports an object to be modeled 2, and a stage-lifting/lowering mechanism 12 (FIG. 2) that lifts/lowers the stage 6.

Further, the stereolithography apparatus 100 includes a light source unit 20 that emits light to the photo-curing resin 1, a blade 7 that flattens a surface of the photo-curing resin 1, and a light source-moving mechanism 14 (FIG. 2) that moves the light source unit 20 and the blade 7 in a horizontal direction (XY-direction). Further, the stereolithography apparatus 100 includes a cooling mechanism 80 mounted on the light source unit 20 and a circulation pump 15 (FIG. 2) that circulates water inside the cooling mechanism 80.

Further, the stereolithography apparatus 100 includes a photo-detector 60 that detects light emitted from the light source unit 20, a control unit 11 (FIG. 2) that comprehensively controls the respective units of the stereolithography apparatus 100, and a storage unit 17 (FIG. 2) that stores various programs and various types of data required for processing of the control unit 11.

The resin tank 5 is a container whose upper portion is opened and is capable of storing therein the liquid photo-curing resin 1. An ultraviolet-curable resin as an epoxy-based resin and a urethane-based resin, for example, is used as the photo-curing resin 1. Alternatively, the photo-curing resin 1 may be a resin to be cured by light in another wavelength region such as visible light. The material of the photo-curing resin 1 is not particularly limited. The stage 6 is a flat plate-shaped member. The stage 6 supports the object to be modeled 2, which is formed by being cured by light emitted from the light source unit 20, from below.

The stage-lifting/lowering mechanism 12 is configured to be capable of moving the stage 6 in upper and lower directions (Z-axis direction). When the object to be modeled 2 is formed, the stage-lifting/lowering mechanism 12 moves the stage 6 downward by a predetermined distance every time one layer of the object to be modeled 2 is formed.

The distance by which the stage 6 is moved downward is equal to a thickness T of the one layer of the object to be modeled 2. Moreover, the distance by which the stage 6 is moved downward is equal to a exposure depth D of the light source unit 20 with respect to the photo-curing resin 1. In this embodiment, the thickness T of the one layer and the exposure depth D are set to 20 μm. It should be noted that the thickness T of the one layer and the exposure depth D can be modified as appropriate within a range of several tens of μm to several hundreds of μm, for example.

The light source unit 20 emits light to the surface of the photo-curing resin 1 (surface flattened by the blade 7) while being moved by the light source-moving mechanism 14 in a scan direction (Y-axis direction). In this manner, the light source unit 20 exposures (cures) layers of the photo-curing resin 1 to light one by one. The light source unit 20 includes a plurality of laser elements 51 (see FIG. 7) arranged in the X-axis direction. The light source unit 20 exposures (cures) the photo-curing resin 1 to light as dots with respective light beams emitted from those laser elements 51.

In this embodiment, a distance L between a lower end surface of the light source unit 20 (a lower end surface of the convergent rod lens 22 to be described later) and the surface (after flattening) of the photo-curing resin 1 is set to 2 mm. It should be noted that the distance L can be modified as appropriate. The height of the light source unit 20 has been adjusted such that a focal point position of light emitted from the light source unit 20 becomes a position of the surface (after flattening) of the photo-curing resin 1 or a position at several μm to several tens of μm from the surface. It should be noted that a specific configuration of the light source unit 20 will be described in detail later.

The blade 7 is arranged on the front side (on the left-hand side in FIG. 1) in the travelling direction of the light source unit 20 and is made movable integrally with the light source unit 20 by the light source-moving mechanism 14. The distance between the blade 7 and the light source unit 20 is set to 30 mm, for example. This distance can be modified as appropriate. The blade 7 is a flat plate-shaped member. The blade 7 is moved by the light source-moving mechanism 14 with the lower surface of the blade 7 held in contact with the surface of the photo-curing resin 1. In this manner, the blade flattens the surface of the photo-curing resin 1.

The light source-moving mechanism 14 is configured to be capable of moving the light source unit 20 and the blade 7 in three axis directions of the X-axis direction, the Y-axis direction, and the Z-axis direction. When the object to be modeled 2 is formed, the light source-moving mechanism 14 moves the light source unit 20 and the blade 7 in the scan direction (Y-axis direction) after the light source unit 20 and the blade 7 are positioned on one end side of the resin tank 5 in the Y-axis direction (exposure start position: right-hand side in FIG. 1). Further, the light source-moving mechanism 14 moves the light source unit 20 and the blade 7, which have been moved to the other end side (left-hand side) of the resin tank 5 in the scan direction (Y-axis direction), in the Z-axis direction (upward) not to be held in contact with a surface of a thermosetting resin 1. After that, the light source-moving mechanism 14 moves the light source unit 20 and the blade 7 to one end side (right-hand side) of the resin tank 5 again and returns the light source unit 20 and the blade 7 to the original position.

It should be noted that the light source-moving mechanism 14 moves the light source unit 20 and the blade 7 in the X-axis direction in a case where the width (in the X-axis direction) of the object to be modeled 2 is large and exceeds the width for which the light source unit 20 can cure the photo-curing resin 1.

It should be noted that in this embodiment, the light source-moving mechanism 14 is configured to be capable of moving the light source unit 20 and the blade 7 in two axis directions of the X-axis and Y-axis directions in the horizontal direction. On the other hand, the light source-moving mechanism 14 may be configured to be capable of moving the light source unit 20 and the blade 7 only in one axis direction of the Y-axis direction in the horizontal direction.

The cooling mechanism 80 is mounted on the side surface of the light source unit 20. The cooling mechanism 80 cools the light source unit 20 by receiving heat generated at the light source unit 20. The cooling mechanism 80 includes a casing 81 capable of housing water inside and two tubes 82 connected to the casing 81. One tube 82 of the two tubes 82 is a tube for water supply. The other tube 82 is a tube for water discharge. The circulation pump 15 is arranged inside a water circulation path in the cooling mechanism 80 and circulates water in the cooling mechanism 80.

Figure 3:
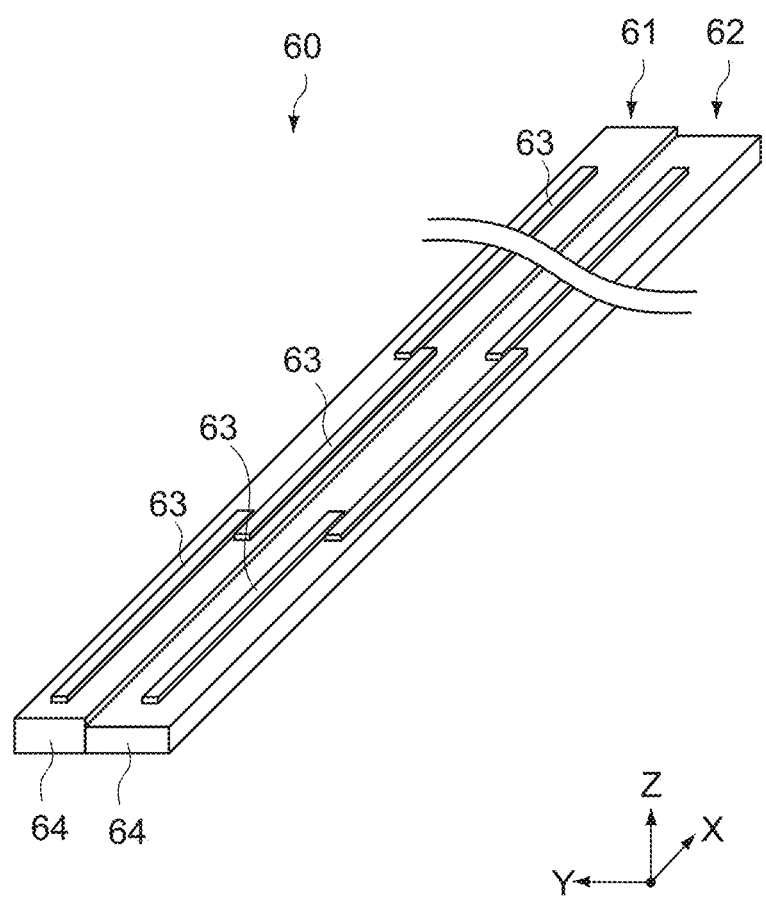
FIG. 3 A perspective view showing a photo-detector.

FIG. 3 is a perspective view showing the photo-detector 60. Referring to FIGS. 1 and 3, the photo-detector 60 is arranged on the front side (on a lower side in FIG. 1) in a light-emitting direction of the light source unit 20 and detects light emitted from the light source unit 20.

In this embodiment, the photo-detector 60 is arranged on a support table 64 mounted on the outer circumferential surface of the resin tank 5. It should be noted that the position at which the photo-detector 60 is provided may be typically any position within the movement range (in the XY-direction) in the light source unit 20.

The photo-detector 60 is configured to be capable of detecting light in a state in which a distance l between the light source unit 20 and the photo-detector 60 is different. Specifically, the photo-detector 60 includes a first photo detector 61 and a second photo detector 62 arranged such that the distance l is different from that of the first photo detector 61. It should be noted that in this embodiment, a case where the number of photo-detectors 60 is two will be described, though the number of photo-detectors 60 may be one or may be three or more.

The first photo detector 61 and the second photo detector 62 each include a plurality of line sensors 63 long in the X-axis direction (direction of arrangement of the laser elements 51). The line sensor 63 includes a plurality of light-receiving elements (the pixel) arranged in the X-axis direction. The number of light-receiving elements (the number of pixels) of one line sensor 63 is set to 5400 (5400 pixels) in this embodiment. Further, the distance (pixel pitch) between the light-receiving elements adjacent to each other is set to 4 μm in this embodiment and the resolution is set to 4 μm.

Here, for accurately detecting an amount-of-light distribution of the laser elements 51 at narrow pitches in the photo-detector 60, the resolution of the line sensors 63 is set to a high resolution value, 4 μm. It should be noted that the number of light-receiving elements and the distance between the light-receiving elements are not limited to the above-mentioned values and can be modified as appropriate.

The plurality of line sensors 63 is arranged in a zigzag pattern and is linearly arranged. Here, the reason why the plurality of line sensors 63 is arranged in a zigzag pattern will be described.

In a case where the length of the line sensors 63 which can be taken out from one wafer is less than a desired length, it is necessary to linearly arrange the plurality of line sensors 63. On the other hand, in this embodiment, as described above, the distance between the adjacent light-receiving elements is set to a small distance value, 4 μm. Further, regarding the line sensors 63 adjacent to each other, a distance between a light-receiving element located at an outermost end of the one line sensor 63 and a light-receiving element located at an outermost end of the other line sensor 63 needs to be set to 4 μm.

However, in a case where the plurality of line sensors 63 is simply linearly arranged, the distance between the light-receiving element located at the outermost end of the one line sensor 63 and the light-receiving element located at the outermost end of the other line sensor 63 cannot be set to 4 μm. Therefore, in this embodiment, the distance between the light-receiving element located at the outermost end of the one line sensor 63 and the light-receiving element located at the outermost end of the other line sensor 63 is set to 4 μm by arranging the plurality of line sensors 63 in a zigzag form.

Referring to FIG. 1, the height of the first photo detector 61 is set such that the height of the image plane is equal to the height of the surface (after flattening) of the photo-curing resin 1. That is, in this embodiment, a distance l1 from the lower end surface of the light source unit 20 to an image plane of the first photo detector 61 is equal to the distance L from the lower end surface of the light source unit 20 to the surface (after flattening) of the photo-curing resin 1 (l1=L).

On the other hand, the height of the second detector is set such that the position of the image plane in the height direction is lower than the surface (after flattening) of the photo-curing resin 1 by an amount corresponding to the exposure depth D. That is, in this embodiment, a distance l2 from the lower end surface of the light source unit 20 to an image plane of the second photo detector 62 is equal to a value obtained by adding the exposure depth D to the distance L from the lower end surface of the light source unit 20 to the surface (after flattening) of the photo-curing resin 1 (l2=L+D).

It should be noted that the positions of the image planes of the first photo detector 61 and the second photo detector 62 can be modified as appropriate as long as those positions fall within a range between the surface (after flattening) of the photo-curing resin 1 and a position lower than the surface (after flattening) by an amount corresponding to the exposure depth D. That is, the positions of the image planes of the first detector and the second photo detector 62 are set to satisfy a condition of L≤l≤L+D by using the distance L, the distance l (l1, l2), and the exposure depth D.

The control unit 11 (see FIG. 2) is a central processing unit (CPU), for example, and comprehensively controls the respective units of the stereolithography apparatus 100. For example, the control unit 11 performs processing of forming the object to be modeled 2 on the basis of modeling data (three-dimensional computer aided design (CAD) data). It should be noted that processing of the control unit 11 will be described later.

The storage unit 17 includes a nonvolatile memory in which various programs and various types of data required for processing of the control unit 11 are stored and a volatile memory used as a working area of the control unit 11. Those programs may be read from a portable memory such as an optical disc and a semiconductor memory or may be downloaded from a server apparatus over a network.

<Configuration of Light Source Unit 20>

Figure 4:
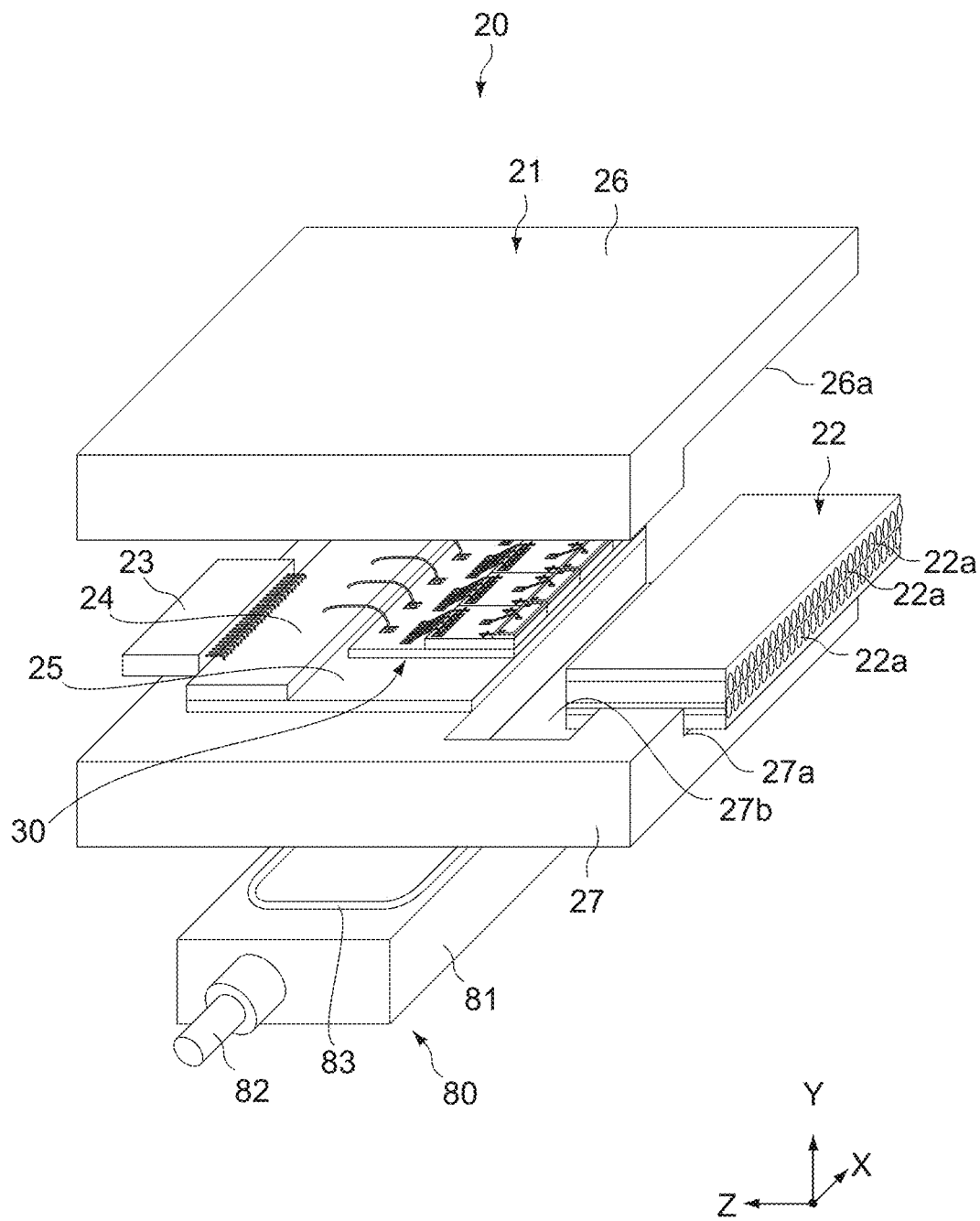
FIG. 4 An exploded perspective view showing a light source unit.

Next, a configuration of the light source unit 20 will be described specifically. FIG. 4 is an exploded perspective view showing the light source unit 20.

In this embodiment, regarding sizes of the entire light source unit 20, the width (in the X-axis direction) is set to 420 mm, the depth (in the Y-axis direction) is set to 30 mm, and the height (in the Z-axis direction) is set to 50 mm. It should be noted that in the present specification, the sizes of the width, the depth, and the height of the respective units to be described are merely exemplary and can be modified as appropriate.

As shown in FIG. 4, the light source unit 20 includes a casing 21 that houses therein the respective parts of the light source unit 20, a light-emitting module 30, and a convergent rod lens 22 located on the light-emitting side of the light-emitting module 30. Further, the light source unit 20 includes a connector 23, a glass-epoxy board 24 to which the connector 23 is attached, and a heat transfer plate 25 on which the light-emitting module 30 and the glass-epoxy board 24 are mounted.

The casing 21 has a rectangular parallelepiped shape long in the X-axis direction (direction of arrangement of the laser elements 51). The casing 21 includes a first substrate 26 and a second substrate 27. The casing 21 is formed of various metallic materials (e.g., stainless steel). It should be noted that any material may be used as the material used for the casing 21 as long as it is a material having strength and thermal conductivity equal to or higher than a certain level. The first substrate 26 and the second substrate 27 are fixed by screwing or the like and are integrated to constitute the casing 21.

The first substrate 26 includes a groove portion 26a for fitting the convergent rod lens 22 therein, a groove portion (not shown) for fitting the connector 23 therein, and the like. Further, the second substrate 27 includes a groove portion 27a for fitting the convergent rod lens 22 therein, a groove portion 27b formed between the light-emitting module 30 and the convergent rod lens 22, and the like. The cooling mechanism 80 is fixed by screwing or the like via an O-ring 83 at a position in the outer circumferential surface which corresponds to the position at which the heat transfer plate 25 is arranged on the second substrate.

The convergent rod lens 22 concentrates each of light beams emitted from the respective laser elements 51 of the light-emitting module 30 and forms an image on the surface (after flattening) of the photo-curing resin 1. The convergent rod lens 22 is fixed by being fitted in the aperture of the casing 21 which is formed by the groove portion 26a of the first substrate 26 and the groove portion 27a of the second substrate 27.

The convergent rod lens 22 is configured such that a plurality of rod lenses 22a having a columnar shape long in the Z-axis direction is arranged in the two axis directions of the X-axis and Y-axis directions. In this embodiment, a SELFOC (registered trademark) lens array manufactured by Nippon Sheet Glass Company, Ltd is used as the convergent rod lens 22 and the focal distance from the lower end surface of the convergent rod lens 22 is set to about 2 mm.

The heat transfer plate 25 is formed of various metallic materials (e.g., copper). It should be noted that any material may be used as the material used for the heat transfer plate 25 as long as it is a material having strength and thermal conductivity equal to or higher than a certain level. The light-emitting module 30 and the glass-epoxy board 24 are mounted on the heat transfer plate 25. The heat transfer plate 25 on which those are mounted is fixed on the second substrate 27 via an adhesive 9 (e.g., ultraviolet curing silver paste) having high thermal conductivity.

Fixation between the heat transfer plate 25 and the second substrate 27 is performed by screwing with a screw from the side of the second substrate 27. Further, screwing between the heat transfer plate 25 and the second substrate 27 is performed on the side of the glass-epoxy board 24, not on the side of the light-emitting module 30. It should be noted that for preventing the accuracy of the distance between the laser elements 51 in the light-emitting module 30 from being affected, screwing between the heat transfer plate 25 and the second substrate 27 is performed on the side of the glass-epoxy board 24, not on the side of the light-emitting module 30 in this manner.

The connector 23 is electrically connected to the glass-epoxy board 24. Electric power for driving the light source unit 20 and various signals are input into this connector 23. The glass-epoxy board 24 and the light-emitting module 30 (driver IC 31 to be described later) are connected by wire bonding.

It should be noted that a clearance between the first substrate 26 and the second substrate 27, a clearance between the casing 21 and the convergent rod lens 22, and a clearance between the casing 21 and the connector 23 are hermetically sealed with an adhesive in order to prevent volatile matters of the photo-curing resin 1 from entering.

Next, the process of assembling the light source unit 20 will be briefly described. First of all, the light-emitting module 30 and the glass-epoxy board 24 provided with the connector 23 are mounted on the heat transfer plate 25. Next, the light-emitting module 30 (driver IC 31) and the glass-epoxy board 24 are connected by wire bonding.

Next, the heat transfer plate 25 on which the light-emitting module 30 and the glass-epoxy board 24 are mounted is fixed on the second substrate 27 via the adhesive 9 having high thermal conductivity. This fixation is performed by screwing. However, this screwing is performed on the side of the glass-epoxy board 24, not on the side of the light-emitting module 30.

Next, the first substrate 26 and the second substrate 27 are fixed by screwing. Then, the convergent rod lens 22 is fixed to the aperture of the casing 21 which is formed by the groove portion 26a of the first substrate 26 and the groove portion 27a of the second substrate 27. In this fixation, the convergent rod lens 22 is temporarily fixed to the casing 21 with a ultraviolet curing adhesive after the position of the convergent rod lens 22 relative to the light-emitting module 30 is adjusted for improving the accuracy of the imaging position.

Next, the clearance between the first substrate 26 and the second substrate 27, the clearance between the casing 21 and the convergent rod lens 22, and the clearance between the casing 21 and the connector 23 are hermetically sealed with an adhesive. At last, the cooling mechanism 80 is fixed to the casing 21 (second substrate 27) by screwing.

[Light-Emitting Module 30]

Figure 5:
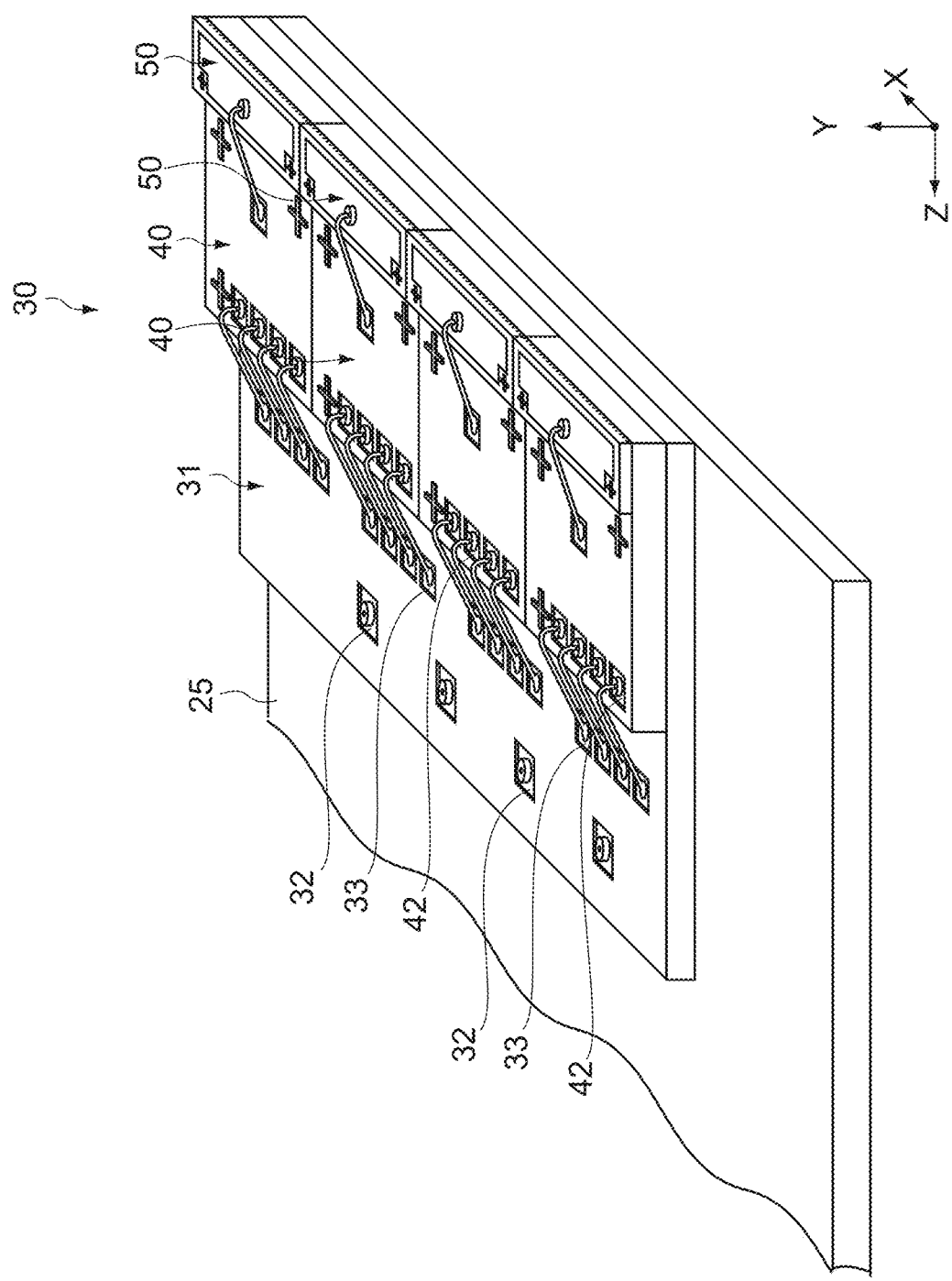
FIG. 5 A perspective view showing a light-emitting module in the light source unit.
Figure 6:
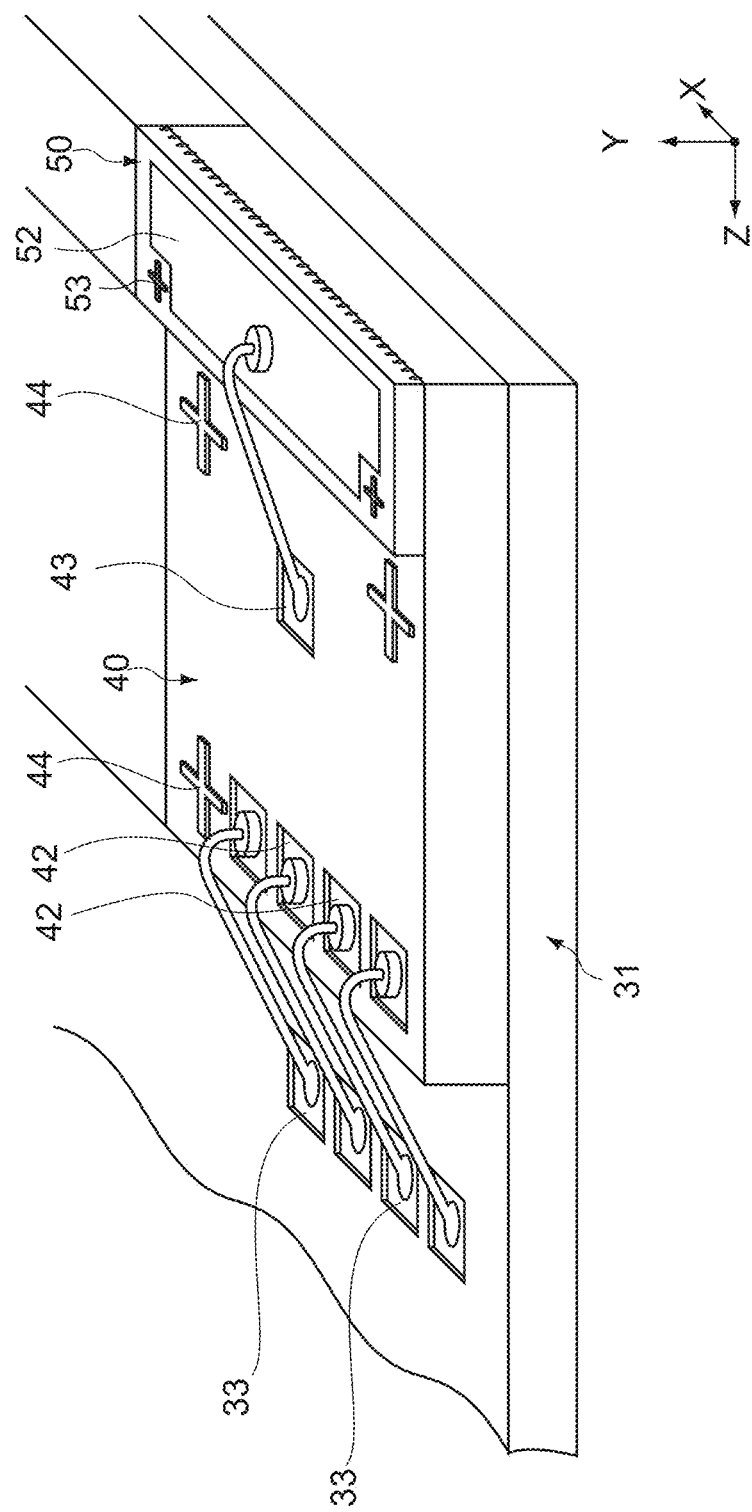
FIG. 6 An enlarged perspective view showing a part of the light-emitting module.

Next, a configuration of the light-emitting module 30 will be described specifically. FIG. 5 is a perspective view showing the light-emitting module 30 in the light source unit 20. FIG. 6 is an enlarged perspective view showing a part of the light-emitting module 30.

Figure 7:
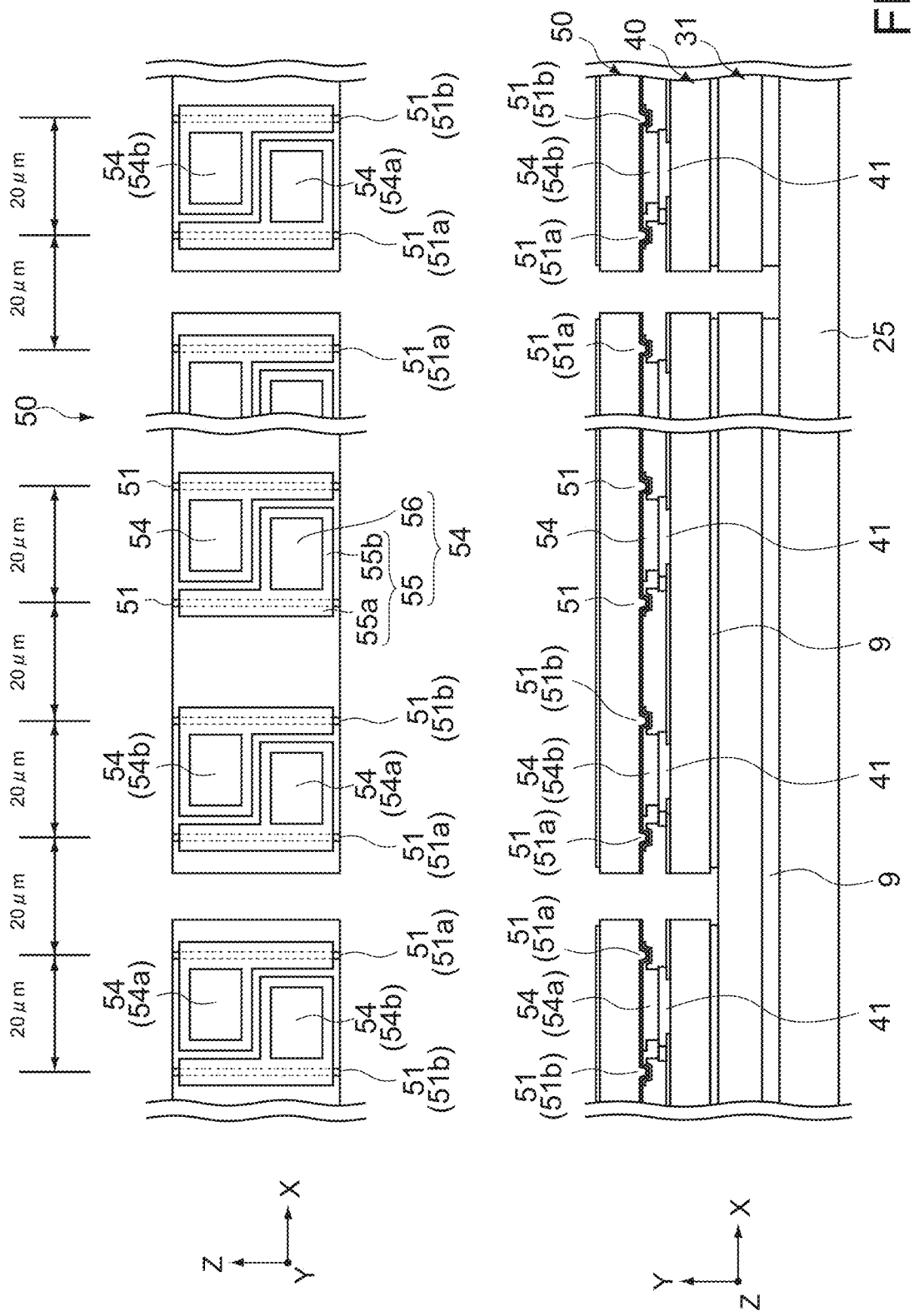
FIG. 7 A bottom view of multi-laser chips in the light-emitting module and a side view of the light-emitting module as viewed from a light-emitting side.
Figure 8:
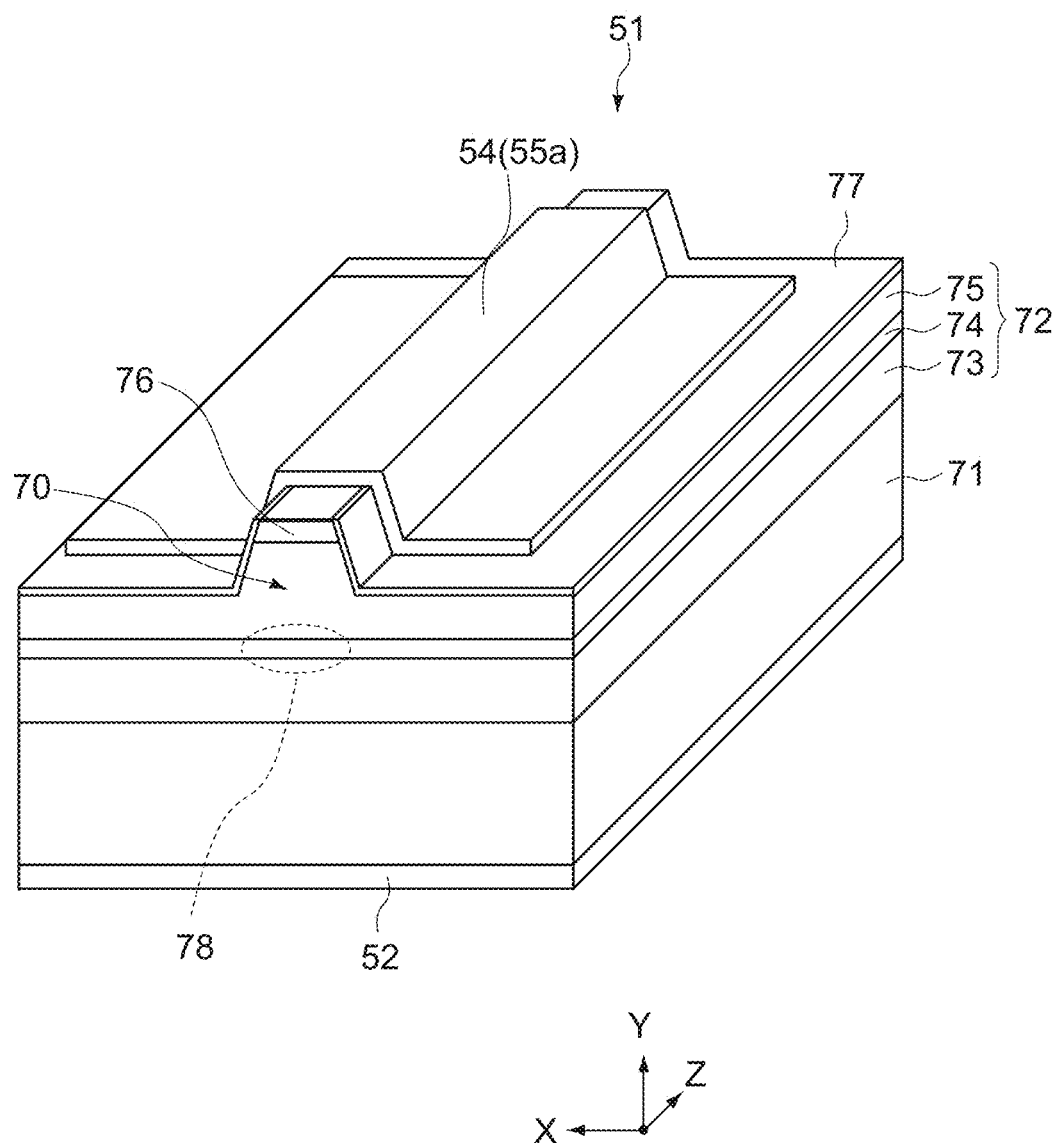
FIG. 8 An enlarged perspective view of a laser element in the multi-laser chip as viewed from below.

FIG. 7 is a bottom view of a multi-laser chip 50 in the light-emitting module 30 and is a side view of the light-emitting module 30 as viewed from the light-emitting side. FIG. 8 is an enlarged perspective view of the laser elements 51 in the multi-laser chip 50 as viewed from the lower side. It should be noted that FIG. 8 shows a state of the multi-laser chip 50 as viewed from the lower side, and it is thus shown in an inverted state in upper and lower directions in comparison with FIGS. 5 to 7.

As shown in those figure, the light-emitting module 30 includes a plurality of driver ICs 31 (mount members), a plurality of sub-mounts 40 (sub-mount members) mounted on the driver ICs 31, and the multi-laser chip 50 (multi-light emitter) mounted on the sub-mounts 40. It should be noted that although only one driver IC 31 is described in FIG. 5, the light-emitting module 30 is configured such that the plurality of driver ICs 31 is arranged in the X-axis direction.

In this embodiment, the number of driver ICs 31 is 16. It should be noted that the number of driver ICs 31 of the light-emitting module 30 is not particularly limited and can be modified as appropriate.

In this embodiment, regarding the size of the driver IC 31, a width (in the X-axis direction) is set to 20.47 mm, a depth (in the Z-axis direction) is set to 5 mm, and a height (in the Y-axis direction) is set to 0.09 mm as an example. Further, the entire width (in the X-axis direction) in the light-emitting module 30 is about 330 mm as an example. Further, regarding the size of the heat transfer plate 25 on which the light-emitting module 30 is mounted, the width (in the X-axis direction) is set to 350 mm, the depth (in the Z-axis direction) is set to 30 mm, and the height (in the Y-axis direction) is set to 3 mm as an example.

The driver IC 31 is constituted by a silicon board, for example. Further, the driver IC 31 includes a plurality of input electrode pads 32 and a plurality of output electrode pads 33 on the upper surface. The input electrode pads 32 is connected to the glass-epoxy board 24 by wire bonding. On the other hand, the output electrode pads 33 are connected to input electrode pads 42, which are provided in the sub-mounts 40, by wire bonding.

The driver ICs 31 include therein driving circuits for driving the respective laser elements 51 of the multi-laser chips 50 on the plurality of sub-mounts 40 mounted thereon. Signals for controlling light-emitting timings and light-emitting times for driving the respective laser elements 51 are input into the driving circuits from the control unit 11.

Based on those signals, the driving circuits cause the respective laser elements 51 to emit light via the switching circuits (to be described later) in the sub-mounts 40. A single light-emitting time in the laser elements 51 is set to 1 μsecond. The integrated amount of light is adjusted by adjusting the number of times of light emission per unit time.

It should be noted that 16 driver ICs 31 each have a different laser element 51 that serves to control light emission, and thus different signals are input to the 16 driver ICs 31 from the control unit 11.

In this embodiment, 32 sub-mounts 40 are mounted in the X-axis direction (direction of arrangement of the laser elements 51) for one driver IC 31. It should be noted that the number of sub-mounts 40 mounted on one driver IC 31 is not particularly limited and can be modified as appropriate. Further, the sub-mounts 40 are fixed on the driver IC 31 via the adhesive 9 having high thermal conductivity (e.g., ultraviolet curing silver paste: see the lower diagram of FIG. 7).

In this embodiment, regarding sizes of the sub-mount 40, a width (in the X-axis direction) is set to 630 μm, a depth (in the Z-axis direction) is set to 1000 μm, and a height (in the Y-axis direction) is set to 90 μm as an example.

The sub-mount 40 is constituted by a silicon board, for example. The sub-mount 40 includes a plurality of bonding pads 41 (see lower diagram of FIG. 7) on the upper surface, the plurality of input electrode pads 42, and the single common-electrode pad 43. Further, the sub-mount 40 includes a plurality of alignment marks 44 on the upper surface.

The bonding pad 41 is constituted by Au plating with a thickness of 10 μm in this embodiment. This bonding pad 41 is electrically connected to an individual electrode 54 in the multi-laser chip 50. The position and shape of the bonding pad 41 are the same position and shape as the individual electrode (plating portion 56) in the multi-laser chip 50.

The plurality of input electrode pads 42 is connected to the output electrode pads 33 in the driver IC 31 by wire bonding. In this embodiment, the number of input electrode pads 42 are set to four and the size of the input electrode pad is set to 90 μm×90 μm. The four input electrode pads 42 are used for power supply, GND, first switching pulse input, and second switching pulse input, for example.

A common-electrode pad 43 is connected to a common electrode 52 of the multi-laser chip 50 by wire bonding. In this embodiment, the size of the common-electrode pad 43 is set to 90 μm×90 μm.

The sub-mount 40 includes therein a switching circuit that individually switches each laser element 51 of the multi-laser chip 50 mounted thereon to cause it to emit light. Specifically, the switching circuit switches the plurality of laser elements 51 in the multi-laser chip 50 to cause them to emit light in accordance with a switching pulse input from the driver IC 31 (the driving circuit) via the input electrode pads 42.

The alignment marks 44 are used when the multi-laser chip 50 is mounted on the sub-mount 40. Moreover, the alignment marks 44 are used when the sub-mount 40 on which the multi-laser chip 50 has been mounted is mounted on the driver IC 31.

In this embodiment, one multi-laser chip 50 is mounted for one sub-mount 40. It should be noted that the number of multi-laser chips 50 mounted for one sub-mount 40 may be plural.

In this embodiment, regarding sizes of the multi-laser chip 50, a width (in the X-axis direction) is set to 630 μm (equal to the width of the sub-mounts 40), a depth (in the Z-axis direction) is set to 280 μm, and a height (in the Y-axis direction) is set to 90 μm as an example.

The multi-laser chip 50 is constituted by a GaN board, for example. The multi-laser chip 50 includes the plurality of laser elements 51 having a shape long in the Z-axis direction. The plurality of laser elements 51 is arranged to be spaced apart from each other by a predetermined distance in the X-axis direction (one direction) and emits light in the Z-axis direction (direction orthogonal to the one direction). In this embodiment, the oscillation wavelength of the laser elements 51 is set to 405 nm.

Further, the multi-laser chip 50 includes a common electrode 52 commonly used in the plurality of laser elements 51 and alignment marks 53 on the upper surface. Further, the multi-laser chip 50 includes the plurality of individual electrodes 54 for respectively individually supplying the plurality of laser elements 51 with electric power on the lower surface.

In this embodiment, the number of laser elements 51 of one multi-laser chip 50 is set to 32. It should be noted that this number can be modified as appropriate. Further, in this embodiment, a distance (distance between the ridges) between the two laser elements 51 adjacent to each other is set to 20 μm. It should be noted that the distance between the laser elements 51 can also be modified as appropriate and this distance is typically set to 100 μm or less.

Here, the number of driver ICs 31 is set to 16, the number of sub-mounts 40 mounted on one driver IC 31 is set to 32, and the number of laser elements 51 corresponding to the sub-mount 40 is set to 32 in the light-emitting module 30 in this embodiment. Therefore, the light-emitting module 30 includes a total of 16384 (=16×32×32) laser elements 51 in this embodiment.

The common electrode 52 is formed in the entire upper surface of the multi-laser chip 50 and is connected to the common-electrode pad 43 in the sub-mount 40 by wire bonding. The common electrode 52 is configured by stacking an alloy of Au and Ge, Ni, Au, and the like, for example. The alignment marks 53 are used when the multi-laser chip 50 is mounted on the sub-mount 40. Moreover, the alignment marks 53 are used when the sub-mount 40 on which the multi-laser chip 50 has been mounted is mounted on the driver IC 31.

Here, the two individual electrodes 54 that supply the two laser elements 51 adjacent to each other with electric power are commonly arranged in the region between the two laser elements 51 adjacent to each other (the region in the lower surface of the multi-laser chip 50).

In other words, the region between the two laser elements 51 adjacent to each other is commonly used as one region in which the two individual electrodes 54 that supply each of the two laser elements 51 adjacent to each other with electric power are arranged. It should be noted that the reason why the individual electrodes 54 are arranged in this manner will be described later.

The individual electrode 54 includes an electrode main body 55 and a plating portion 56 formed on the electrode main body 55. The electrode main body 55 is configured by stacking Ti, Pt, Au, and the like, for example. The electrode main body 55 includes a coating portion 55$a$ formed to cover the laser elements 51 and a base 55$b$ pulled out from the coating portion 55$a$. The base 55$b$ is set to have a size which is about a half of the size of the region between the two laser elements 51 adjacent to each other. Further, one of two bases 55$b$ arranged in such a region is arranged on the front side (in the Z-axis direction) and the other is arranged on the rear side (in the Z-axis direction).

The plating portion 56 is constituted by Au plating with a thickness of 2 μm in this embodiment. This plating portion 56 constituted by Au is subjected to Au—Au ultrasonic bonding with respect to the bonding pad 41 (Au) in the sub-mount 40, such that the multi-laser chip 50 is flip-chip mounted on the sub-mount 40. It should be noted that the bonding method is not limited thereto and Au—Sn bonding, Cu—Cu bonding, or the like may be employed.

It should be noted that the individual electrode 54 actually has a shape longer in the Z-axis direction than that drawn in FIGS. 7 and 8.

Referring to FIG. 8, the laser element 51 is set to have a structure in which a ridge portion 70 (optical waveguide) having a belt-like shape long in the Z-axis direction is sandwiched by a pair of a front end surface and a rear end surface in a resonator direction (Z-axis direction). That is, the laser element 51 is an edge emitting laser type semiconductor laser.

This laser element 51 is configured by forming a stacked-layer semi-conductor layer 72 having a laser structure on a board 71, for example. The semi-conductor layer 72 includes a first cladding layer 73, an activation layer 74, a second cladding layer 75, and a contact layer 76. The layers (e.g., a buffer layer, a guide layer, or the like) other than the above-mentioned layers may be further provided in the semi-conductor layer 72.

The board 71 is formed of a III-V group nitride semiconductor such as GaN, for example. Here, the "III-V group nitride semiconductor" includes at least one kind of 3B group elements and at least N of 5B group elements in the short-period periodic table.

Examples of the III-V group nitride semiconductor can include a gallium nitride-based compound including Ga and N. The gallium nitride-based compound includes GaN, AlGaN, AlGaInN, and the like, for example. The III-V group nitride semiconductor is doped with n-type impurities of a IV group or VI group element such as Si, Ge, O, and Se or p-type impurities of a II group or IV group element such as Mg, Zn, and C in a manner that depends on needs.

The semi-conductor layer 72 mainly includes a III-V group nitride semiconductor, for example. The first cladding layer 73 is formed of AlGaN, for example. The activation layer 74 has a multiple quantum well structure in which a well layer and a barrier layer respectively formed of GaInN having different composition ratios, for example, are alternately stacked. The second cladding layer 75 is formed of AlGaN, for example. The contact layer 76 is formed of GaN, for example.

The ridge portion 70 is formed protruding from the second cladding layer 75. The ridge portion 70 is a part of the semi-conductor layer 72 and encloses light in the X-axis direction by utilizing a refractive index difference in the X-axis direction. Moreover, current implanted into the semi-conductor layer 72 is confined. A portion of the activation layer 74 which corresponds to the ridge portion 70 is a light-emitting region 78.

The front end surface is a surface from which light is emitted. A multi-layer reflection film (not shown) is formed in this front end surface. Further, the rear end surface is a surface on a side to which light is reflected and the multi-layer reflection film (not shown) is also formed in this rear end surface. The reflectance of the multi-layer reflection film on the side of the front end surface is set to about 10%, for example. Further, the reflectance of the multi-layer reflection film on the side of the rear end surface is set to about 95%, for example.

In the surface of the ridge portion 70 (the surface of the contact layer 76), the coating portion 55a in the individual electrode 54 is provided to cover the entire ridge portion 70. The coating portion 55a is electrically connected to the contact layer 76. It should be noted that an insulating layer 77 is stacked on the semi-conductor layer 72 (a portion excluding the contact layer 76). The insulating layer 77 is formed of $SiO_2$, SiN, $ZrO_2$, and the like, for example.

(Array of Individual Electrodes 54)

Figure 9:
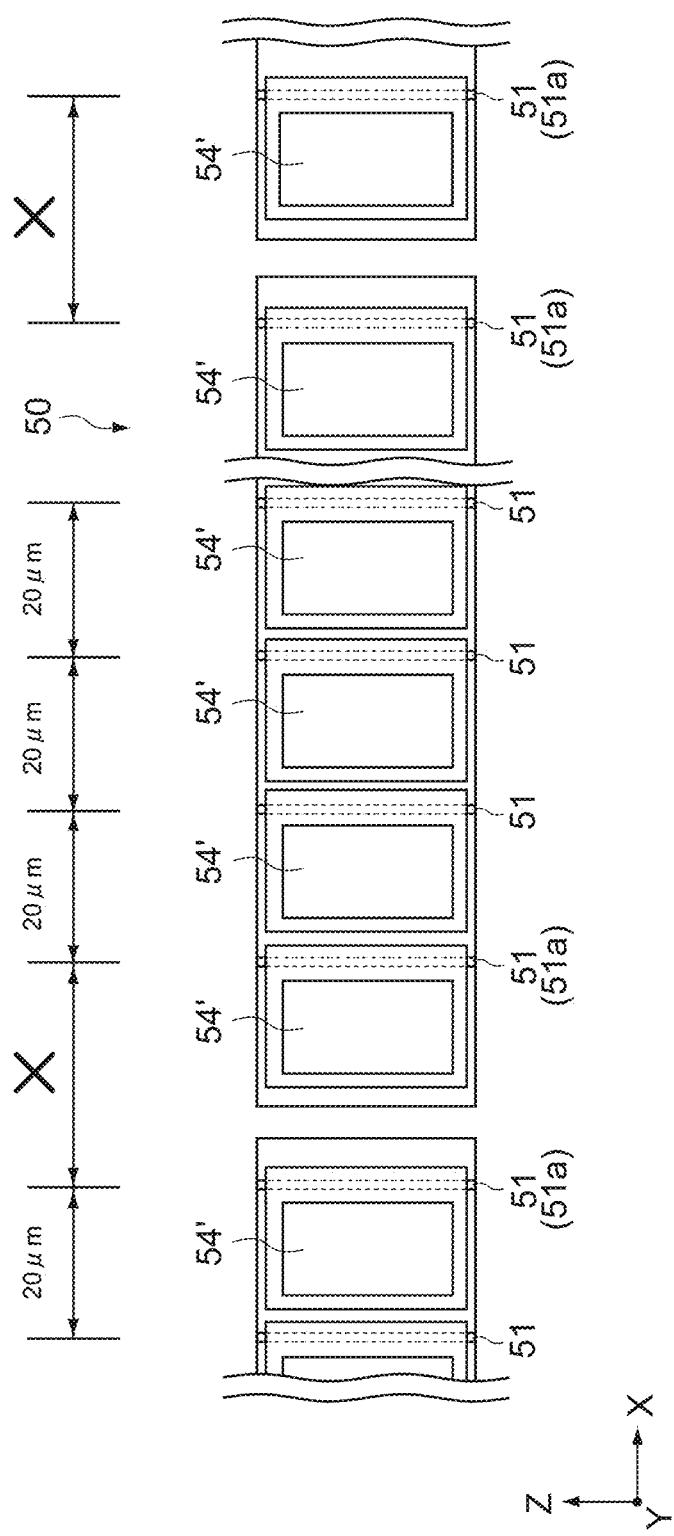
FIG. 9 A diagram showing individual electrodes according to a comparative example.

Next, the reason why the individual electrodes 54 are arranged in the above-mentioned array will be described. In this description, a comparative example will be first described. FIG. 9 is a diagram showing individual electrodes 54' according to the comparative example. As shown in FIG. 9, in the comparative example, the region between the two laser elements 51 adjacent to each other is used as the region in which the individual electrode 54 of the one laser element 51 is arranged.

It should be noted that in the following description, regarding the multi-laser chip 50, the laser elements 51 located at outermost ends on both end sides in the X-axis direction will be referred to as first laser elements 51a.

In a case where the individual electrodes 54' are arranged as shown in FIG. 9, a distance between the first laser element 51a in one multi-laser chip 50 of the multi-laser chips 50 adjacent to each other and the first laser element 51a in the other multi-laser chip 50 is large. That is, the individual electrode 54' to the first laser element 51a (left end) in the one multi-laser chip 50 becomes obstruction and the distance between the laser elements 51 cannot be set to 20 μm with respect to this portion. If the distance between the laser elements 51 is different from the other distance between the laser elements 51, the object to be modeled 2 cannot be accurately formed.

In view of this, in this embodiment, the two individual electrodes 54 that respectively supply the two laser elements 51 adjacent to each other with electric power are commonly arranged in one region between the two laser elements 51 adjacent to each other. Accordingly, as shown in FIG. 7, a distance between the first laser element 51a of the one multi-laser chip 50 of the two multi-laser chips 50 adjacent to each other and the first laser element 51a of the other multi-laser chip 50 can be set to be equal to the other distance (20 μm).

It should be noted that the pattern in which the multi-laser chips 50 are adjacent includes two patterns which are the pattern shown on the left-hand side of FIG. 7 and the pattern shown on the right-hand side of FIG. 7.

In the pattern on the left-hand side of FIG. 7, the multi-laser chips 50 on the respective sub-mounts 40 mounted on the same driver IC 31 are adjacent. In the pattern shown in the right-hand side of FIG. 7, the multi-laser chip 50 on the sub-mount 40 located at an outermost end in the one driver IC 31 of the two driver ICs 31 adjacent to each other and the multi-laser chip 50 on the sub-mount 40 located at an outermost end in the other driver IC 31 are adjacent to each other.

Referring to the left-hand side of FIG. 7, the distance between the first laser element 51a of the one multi-laser chip 50 of the two multi-laser chips 50 adjacent to each other on the same driver IC 31 and the first laser element 51a of the other multi-laser chip 50 is set to be equal to the other distance.

In this manner, the plurality of sub-mounts 40 on which the respective multi-laser chips 50 have been mounted is mounted on the same driver IC 31 with high accuracy such that the distance between the first laser elements 51a in the two multi-laser chips 50 adjacent to each other is equal to the other distance. It should be noted that the above-mentioned alignment marks 44 and 53 are used in mounting at this time.

Referring to the right-hand side of FIG. 7, the distance between the first laser element 51a in the multi-laser chip 50 on the sub-mount 40 located at the outermost end in the one driver IC 31 of the two driver ICs 31 adjacent to each other and the first laser element 51a in the multi-laser chip 50 on the sub-mount 40 located at the outermost end in the other driver IC 31 is set to be equal to the other distance.

In this manner, the plurality of IC chips on which the respective sub-mounts 40 have been mounted is mounted on the heat transfer plate 25 with high accuracy such that the distance between the first laser elements 51a in the two multi-laser chips 50 adjacent to each other on the different drivers IC 31 is equal to the other distance. The above-mentioned alignment marks 44 and 53 are used also in mounting at this time.

Figure 10:
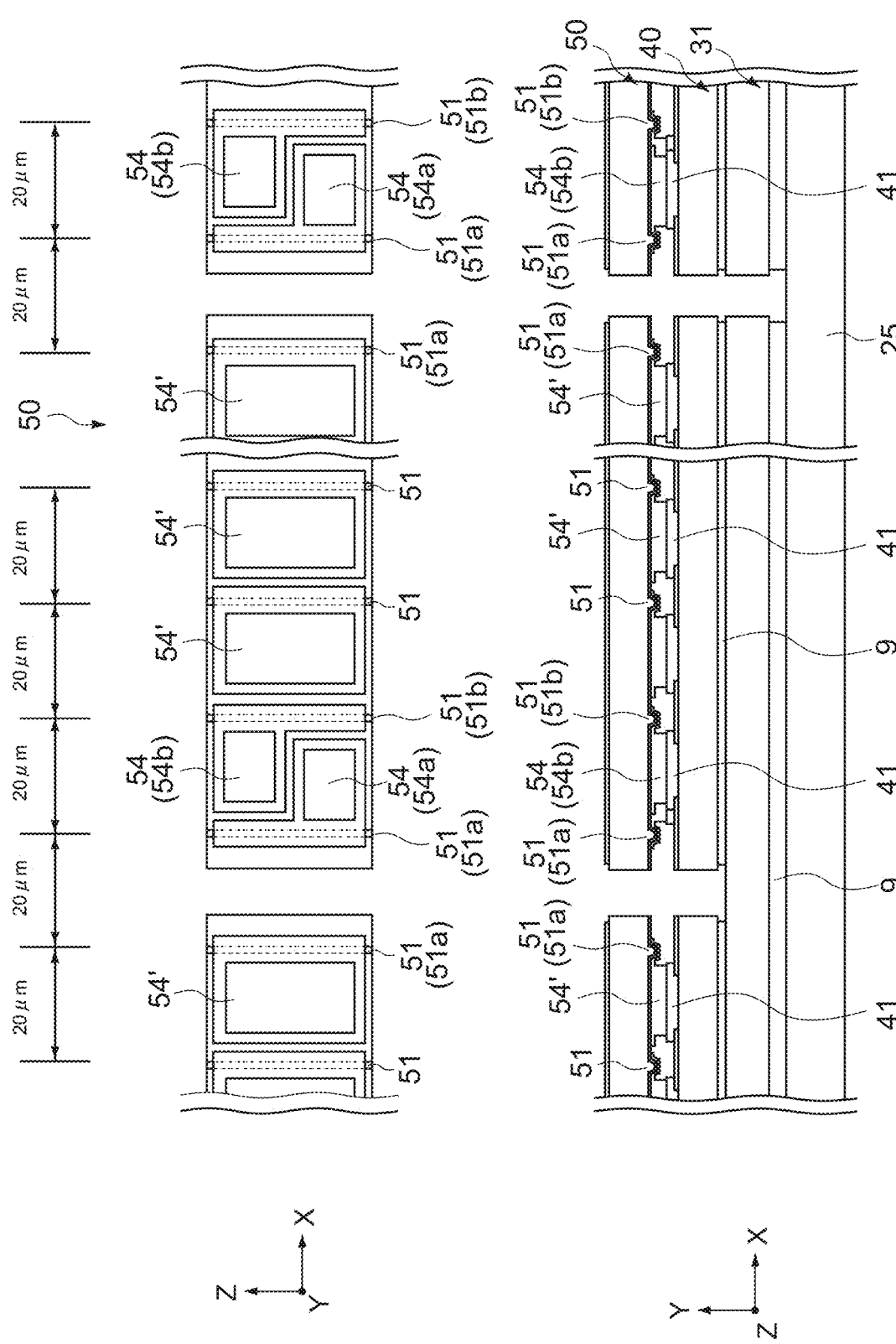
FIG. 10 A diagram showing another example regarding an array of the individual electrodes.

It should be noted that as can be understood from the description above, for setting the distance between the first laser elements 51a in the two multi-laser chips 50 adjacent to each other to be equal to the other distance, it is important where the individual electrodes 54 corresponding to the first laser elements 51a are arranged. In this point, the individual electrodes 54 may be arranged as shown in FIG. 10. FIG. 10 is a diagram showing another example of the array of the individual electrodes 54.

It should be noted that in the following description, the laser elements 51 located at a second-outermost end on the both sides in the X-axis direction with respect to the multi-laser chip 50 will be referred to as second laser elements 51b. Further, the individual electrodes 54 for supplying the first laser elements 51a with electric power will be referred to as first individual electrodes 54a and the individual electrodes 54 for supplying the second laser elements 51b with electric power will be referred to as second individual electrodes 54b.

In the example shown in FIG. 10, the first individual electrode 54a corresponding to the first laser element 51a (left end) and the second individual electrode 54b corresponding to the second laser element 51b (left end) are arranged in a region between the first laser element 51a and the second laser element 51b. That is, the region between the first laser element 51a and the second laser element 51b is commonly used as the region in which the first individual electrode 54a and the second individual electrode 54b are arranged.

With respect to the individual electrodes 54' other than the individual electrodes 54 corresponding to the two laser elements 51 at the left end, one individual electrode 54' is arranged in one region. Also regarding the case as shown in FIG. 10, the distance between the first laser elements 51a in the two multi-laser chips 50 adjacent to each other can be set to be equal to the other distance.

Referring to the left-hand side of FIG. 10, the first individual electrode 54a and the second individual electrode 54b corresponding to the first laser element 51a and the second laser element 51b of one multi-laser chip 50 (right-hand side) of the two multi-laser chips 50 adjacent to each other on the same driver IC 31 are commonly arranged in the region between the first laser element 51a and the second laser element 51b.

Referring to the right-hand side of FIG. 10, the first individual electrode 54a and the second individual electrode 54b corresponding to the first laser element 51a and the second laser element 51b in the multi-laser chip 50 on the sub-mount 40 located at the outermost end of one driver IC 31 (right-hand side) of the two driver ICs 31 adjacent to each other are commonly arranged in the region between the first laser element 51a and the second laser element 51b.

(Distance between Laser Elements 51)

Figure 11:
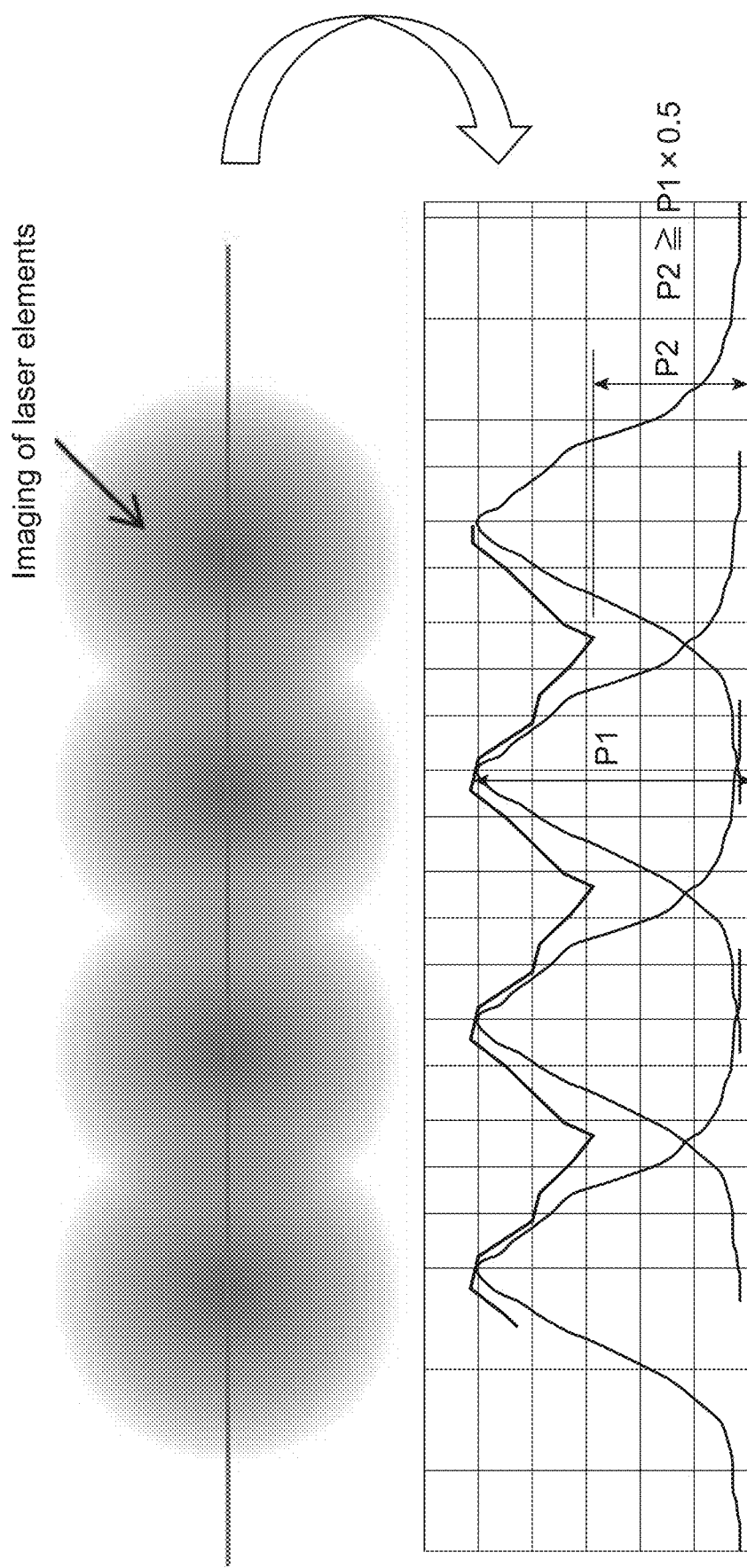
FIG. 11 A diagram for describing how to set a distance between the laser elements.

Next, how to set the distance between the laser elements 51 will be described. FIG. 11 is a diagram for describing how to set the distance between the laser elements 51. An amount-of-light distribution in the plane direction (XY-direction) on the image plane of each laser element 51 (near the surface of the photo-curing resin 1) is shown in the upper diagram of FIG. 11. An amount-of-light distribution on a straight line shown in the upper diagram of FIG. 11 is shown in the lower diagram of FIG. 11. It should be noted that the amount-of-light distribution as shown in FIG. 11 is generated in the control unit 11 on the basis of light detected in the photo-detector 60. Hereinafter, the amount-of-light distribution as shown in FIG. 11 will be referred to as an amount-of-light profile.

Light emitted from the respective laser elements 51 is converged by the convergent rod lens 22 and is imaged at different imaging positions in the X-axis direction. In the stereolithography, a region corresponding to one dot is exposed to light in one laser element 51. In this region corresponding to the one dot, the intensity of light is highest at the imaging center and the intensity of light becomes lower as it becomes farther from the imaging center.

On the other hand, in the stereolithography, two dots cured by the two laser elements 51 adjacent to each other need to be suitably overlap each other. That is, in a case where the distance between the laser elements 51 adjacent to each other is too long, the imaging centers of the respective laser elements 51 are far from each other, and thus the two dots cannot be suitably overlap each other.

Therefore, in this embodiment, the distance between the laser elements 51 adjacent to each other is set to satisfy a relationship of P2≥0.5×P1. Here, P1 is light density at the imaging center each corresponding to the respective light beams emitted from the respective laser elements 51. On the other hand, P2 is light density at a middle position between the two imaging centers adjacent to each other. It should be noted that the relationship between P1 and P2 depends on the exposure sensitivity and the like of the photo-curing resin 1, and thus the relationship between P1 and P2 is not limited to this relational expression and any expression may be used as long as it is a relational expression representing a condition that adjacent dots are suitably overlap each other.

<Operation Description>

Figure 12:
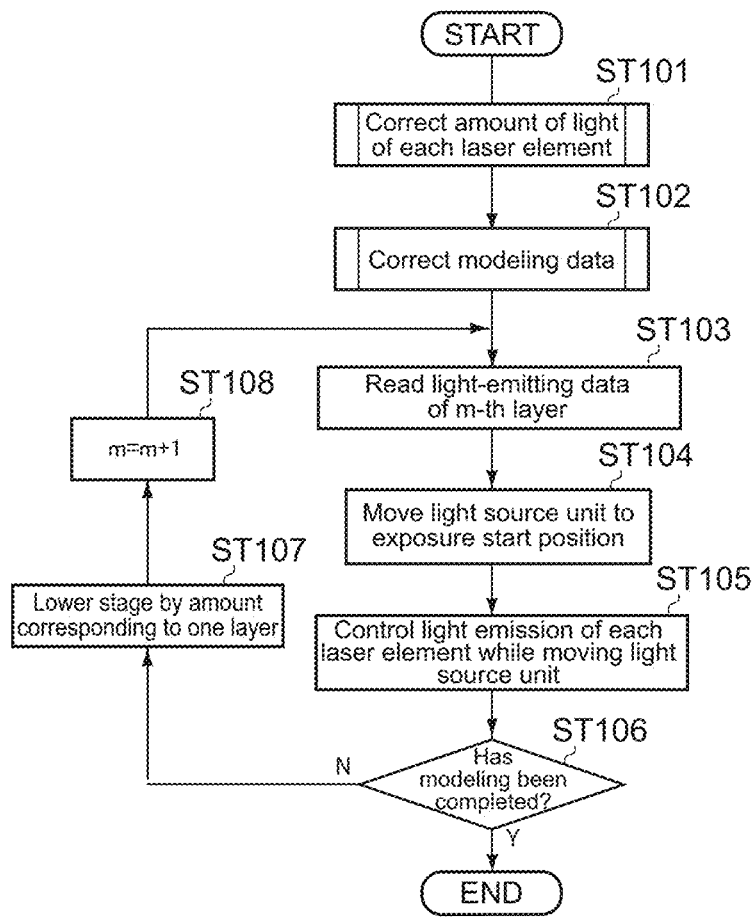
FIG. 12 A flowchart showing processing of a control unit.

Next, processing of the control unit 11 will be described. FIG. 12 is a flowchart showing processing of the control unit 11.

First of all, the control unit 11 generates an amount-of-light profile indicating an amount-of-light distribution of the light on the basis of light detected by the photo-detector 60 and corrects the amount of light of each laser element 51 on the basis of the amount-of-light profile (Step 101).

At this time, the control unit 11 typically performs processing for increasing the amount of light of the laser element 51 which has the amount of light determined to be smaller than the criteria on the basis of the amount-of-light profile. For example, the control unit 11 performs processing of increasing electric power supplied to that laser element 51, processing of increasing the number of times of light emission per unit time, and the like.

Further, the control unit 11 may perform processing for reducing the amount of light of the laser element 51 which has the amount of light determined to be larger than the criteria on the basis of the amount-of-light profile. In this case, for example, the control unit 11 performs processing of reducing the electric power supplied to that laser element 51, processing of reducing the number of times of light emission per unit time, and or the like.

Next, the control unit 11 corrects the modeling data on the basis of the amount-of-light profile (Step 102). The modeling data includes exposure pattern data indicating an exposure pattern for each layer and light-emitting timing data indicating a light-emitting timing of the laser element 51 for each layer.

Here, for example, the position deviation and the like of the laser element 51 due to an increase in temperature of the light-emitting module 30 may lead to deviation of the position of the imaging center of each laser element 51. In such a case, there is a possibility that the object to be modeled 2 cannot be accurately formed when the original modeling data (exposure pattern data, light-emitting timing data) is used as it is. Therefore, the control unit 11 perform processing of correcting the modeling data in Step 102.

After correcting the modeling data, the control unit 11 reads light-emitting timing data for an m-th layer (m=1 to n) from the storage unit 17 (Step 103). Next, the control unit 11 controls the light source-moving mechanism 14 and moves the light source unit 20 to the exposure start position (right-hand side in FIG. 1) (Step 104).

Next, the control unit 11 controls the light source-moving mechanism 14 to move the light source unit 20 in the scan direction (Y-axis direction) while controlling light emission of each laser element 51 on the basis of the light-emitting timing data for the m-th layer to expose the m-th layer to light (Step 105). At this time, a single light-emitting time in the laser elements 51 is set to 1 μsecond. The integrated amount of light is adjusted by adjusting the number of times of light emission per unit time.

When the exposure of the m-th layer to light is completed, the control unit 11 determines whether modeling in the object to be modeled 2 has been completed (m=n) (Step 106). In a case where modeling has not been completed (NO in Step 106), the control unit 11 moves the stage 6 downward by a predetermined distance (Step 107). Then, the control unit 11 adds 1 to m (Step 108) and performs processing of Steps 103 to 106 with respect to this layer.

On the other hand, in a case where modeling in the object to be modeled 2 has been completed (YES in Step 106), the control unit 11 terminates the processing.

It should be noted that in FIG. 12, a case where correction of the amount of light and correction of the modeling data are performed at a timing at which modeling of the object to be modeled 2 is started has been described. However, the timing at which correction of them is performed is not limited thereto. For example, the control unit 11 may perform such correction every time exposure to light for one layer is completed.

Alternatively, the control unit 11 may calculate a timing at which correction is required and perform correction at this timing on the basis of the light-emitting timing data for each layer. Alternatively, the control unit 11 may calculate a timing at which correction is required and perform correction at this timing on the basis of data stored in the past (e.g., data when correction is performed, light-emitting timing data corresponding to a layer exposed to light, and the like).

(Amount-of-Light Correction)

Figure 13:
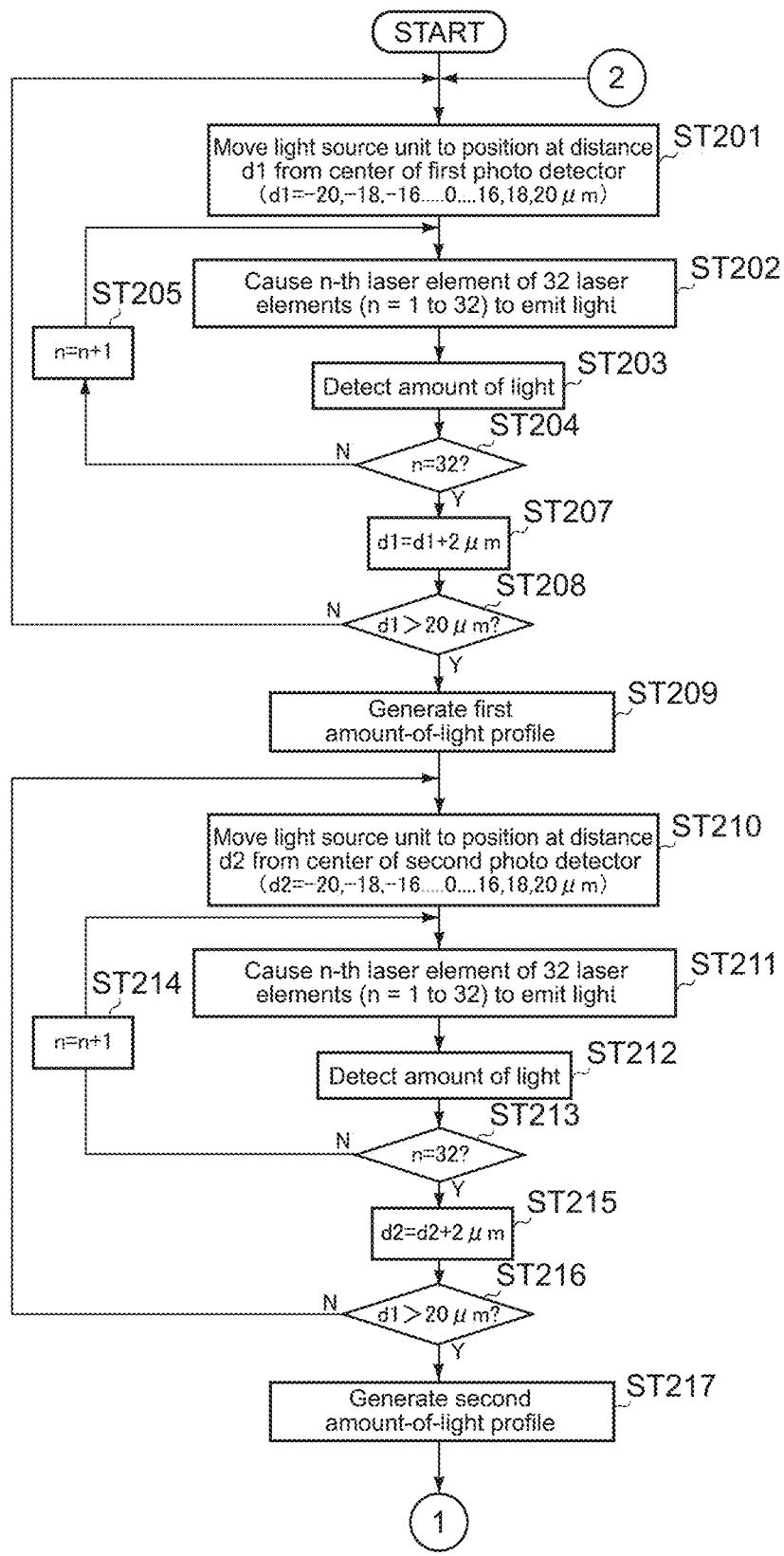
FIG. 13 A flowchart showing processing when correcting an amount of light of each laser element.
Figure 14:
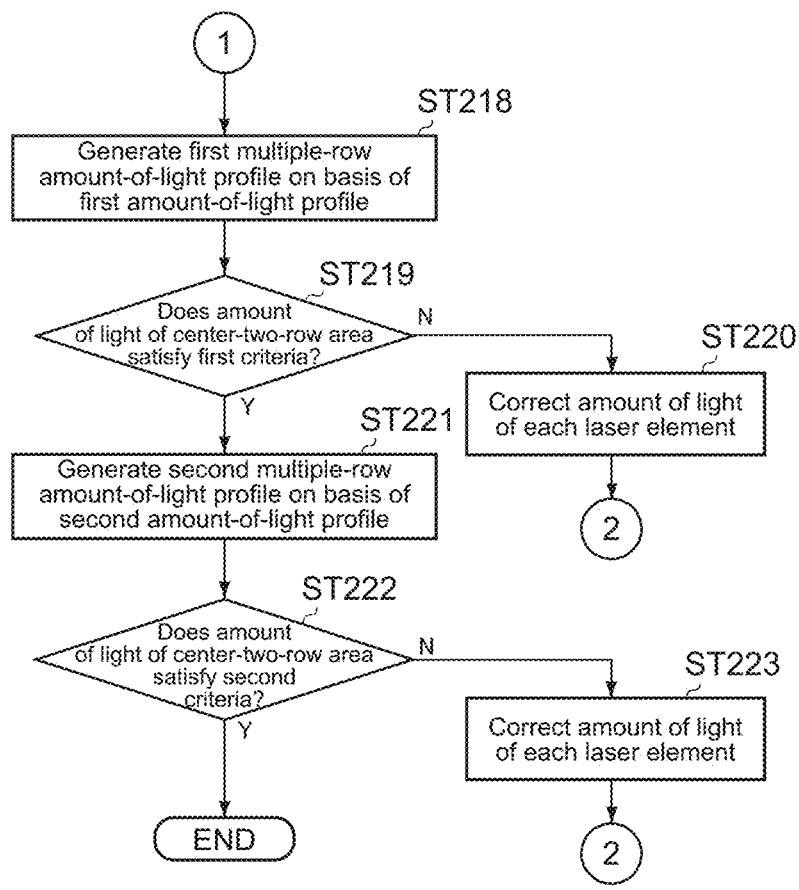
FIG. 14 A flowchart showing processing when correcting the amount of light of each laser element.

Next, processing when correcting the amount of light of each laser element 51 will be described specifically. FIGS. 13 and 14 are flowcharts each showing processing when correcting the amount of light of each laser element 51. It should be noted that here, for the sake of convenience, the description will be made assuming that the first photo detector 61 and the second photo detector 62 are each constituted by the single long line sensor 63.

First of all, the control unit 11 controls the light source-moving mechanism 14 and moves the light source unit 20 onto the first photo detector 61 (Step 201). At this time, the control unit 11 moves the light source unit 20 in the Y-axis direction such that the center of the light source unit 20 (the position of the light-emitting region 78 in the light source unit 20) is located at a position which is at the distance d1 from the center of the first photo detector 61.

It should be noted that the initial value of the distance d1 is set to −20 μm. Here, the value of the distance d1 is plus on the side of the resin tank 5 with respect to the center of the first photo detector 61 in the Y-axis direction and is minus on the opposite side.

After moving the light source unit 20, the control unit 11 causes an n-th laser element 51 of 32 laser elements 51 of one multi-laser chip 50 to emit light (Step 202). It should be noted that the initial value of the n value is 1. Here, because of the provision of 512 multi-laser chips 50, an n-th laser element 51 in each of 512 multi-laser chips 50 is caused to emit light at the same time in the light-emitting module 30 in Step 202.

When causing the n-th laser element 51 to emit light, the control unit 11 causes the first photo detector 61 to detect an amount of light of the laser element 51 (Step 203). Next, the control unit 11 determines whether to cause all the 32 laser elements 51 to emit light (Step 204).

In a case where the laser element 51 which should be caused to emit light is still left (NO in Step 204), the control unit 11 adds 1 to n (Step 205) and causes the next laser element 51 to emit light (Step 202). Then, the control unit 11 causes the first photo detector 61 to detect an amount of light of the laser element 51 (Step 203).

Figure 15:
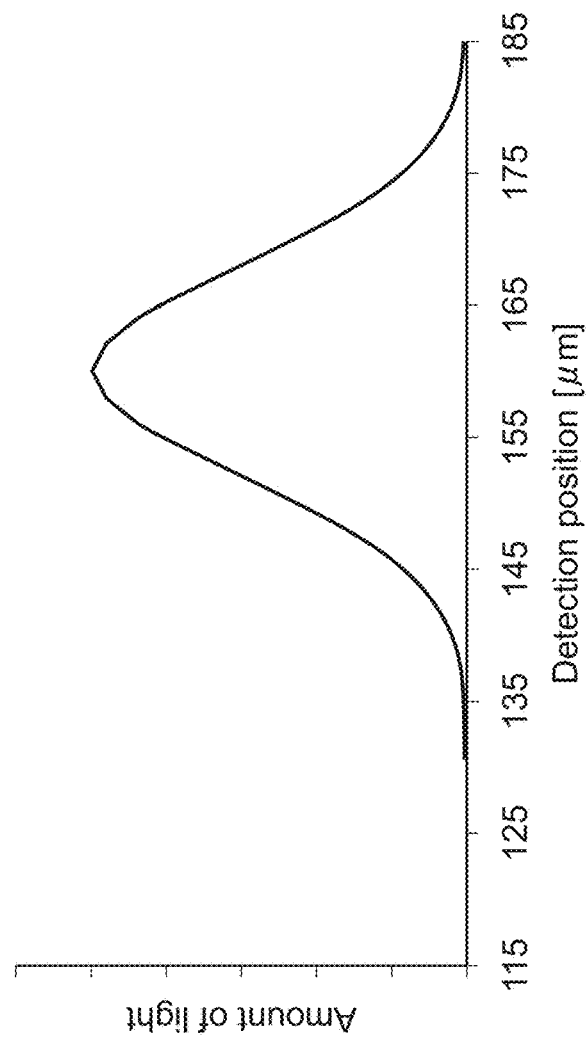
FIG. 15 A diagram showing a state when an n-th laser element 51 is caused to emit light in a state in which the center of the light source unit is located at a position which is at a distance d1 from the center of the first photo detector.
Figure 15:
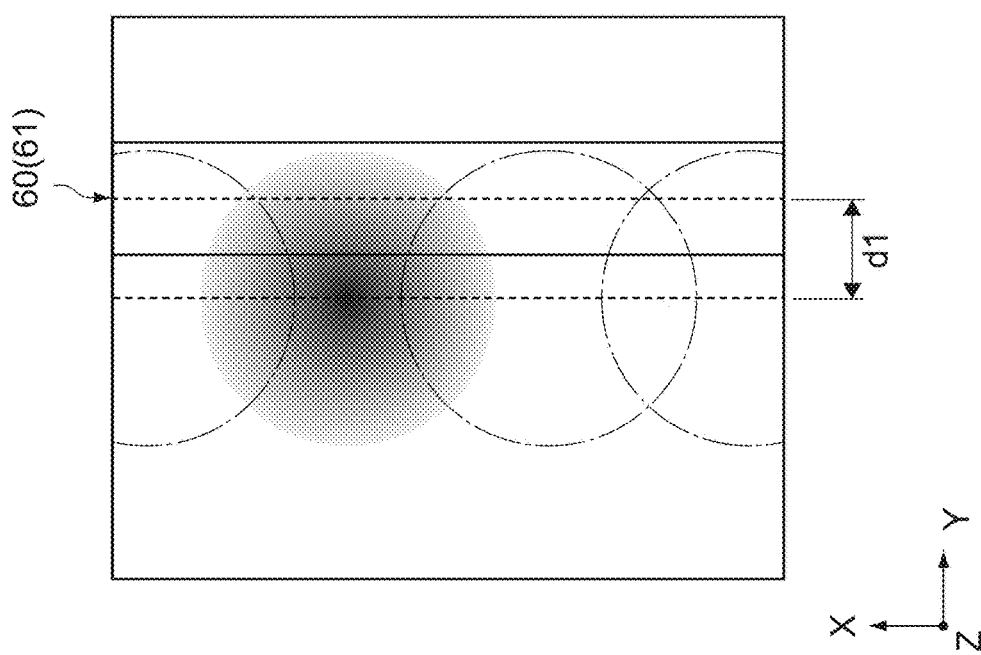

A state when the n-th laser element 51 is caused to emit light with the center of the light source unit 20 located at the position which is at the distance d1 from the center of the first photo detector 61 is shown on the left-hand sides of FIGS. 15 and 16. Further, an example of the amount of light detected by the first photo detector 61 is shown on the right-hand sides of FIGS. 15 and 16.

In a case where all the 32 laser elements 51 are caused to emit light (YES in Step 204), the control unit 11 adds 2 μm to the distance d1 (Step 207) and determines whether the sum is above 20 μm (Step 208).

In a case where the sum is 20 μm or less (NO in Step 208), the control unit 11 causes the light source-moving mechanism 14 to move the light source unit 20 by 2 μm in the Y-axis direction and move the light source unit 20 from the center of the first photo detector 61 to the position which is at the distance d1 (Step 201). After that, the control unit 11 performs processing of Steps 202 to 208 again at the new position which is at the distance d1.

In a case where the distance d1 is above 20 μm in Step 208 (YES in Step 208), the control unit 11 proceeds to next Step 209. In Step 209, the control unit 11 generates a first amount-of-light profile on the basis of the amount of light detected by the first photo detector 61 of each laser element 51.

Figure 17:
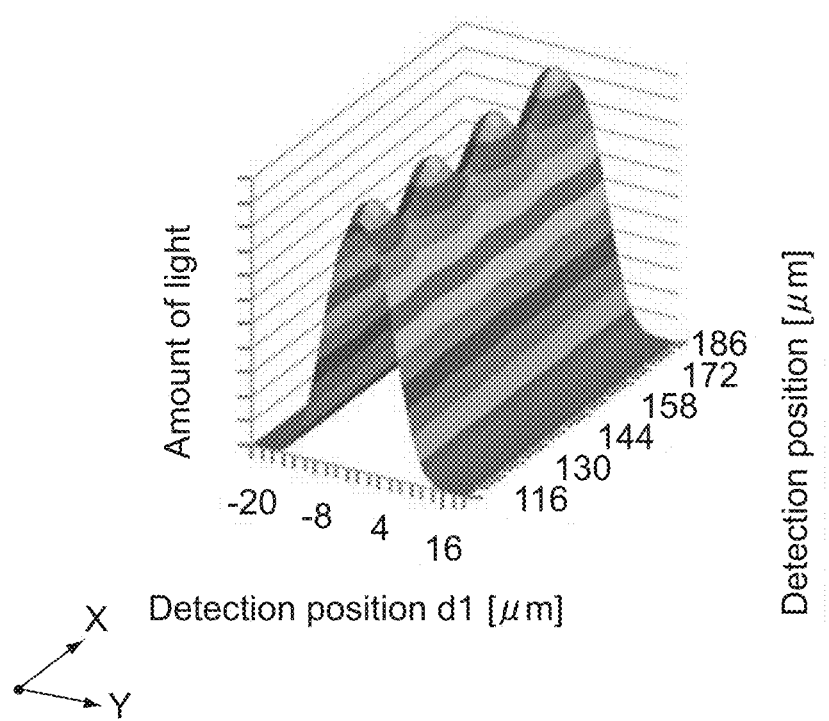
FIG. 17 A diagram showing a first amount-of-light profile.
Figure 18:
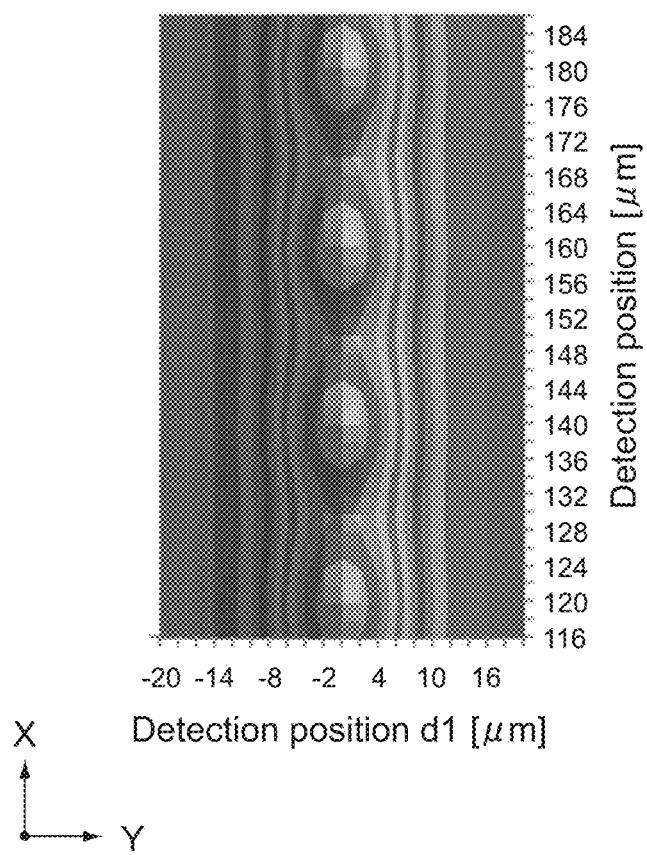
FIG. 18 A diagram showing the first amount-of-light profile.

FIGS. 17 and 18 are diagrams each showing the first amount-of-light profile. As shown in those figure, in this embodiment, the first amount-of-light profile is changed into two-dimensional amount-of-light data in the two axis directions of the X-axis direction (direction of arrangement of the laser elements 51) and the Y-axis direction (scan direction of the light source unit 20).

After generating the first amount-of-light profile, the control unit 11 controls the light source-moving mechanism 14 to move the light source unit 20 onto the second photo detector 62 (Step 210). At this time, the control unit 11 moves the light source unit 20 such that the center of the light source unit 20 (the position of the light-emitting region 78 in the light source unit 20) is located at a position which is at a distance d2 from the center of the second photo detector 62 in the Y-axis direction.

After moving the light source unit 20, the control unit 11 causes the n-th laser element 51 of the 32 laser elements 51 of the one multi-laser chip 50 to emit light (Step 211). Next, the control unit 11 causes the second photo detector 62 to detect an amount of light of the laser element 51 (Step 212).

Next, the control unit 11 determines whether all the 32 laser elements 51 are caused to emit light (Step 213), adds 1 to n in a case where the laser element 51 which should be caused to emit light is still left (Step 214), and causes the next laser element 51 to emit light (Step 210).

In a case where all the 32 laser elements 51 are caused to emit light (YES in Step 213), the control unit 11 adds 2 μm to the distance d1 (Step 215) and determines whether the sum is above 20 μm (Step 216).

In a case where the sum is 20 μm or less (NO in Step 216), the control unit 11 moves the light source unit 20 by 2 μm in the Y-axis direction and moves the light source unit 20 from the center of the first photo detector 61 to the position which is at the distance d2 (Step 210).

In a case where the distance d1 is above 20 µm in Step 216 (YES in Step 216), the control unit 11 generates a second amount-of-light profile on the basis of the amount of light of each laser element 51 detected by the second photo detector 62 (Step 217).

When the second amount-of-light profile is generated, then the control unit 11 generates a first multiple-row amount-of-light profile on the basis of the first amount-of-light profile (Step 218).

Figure 19:
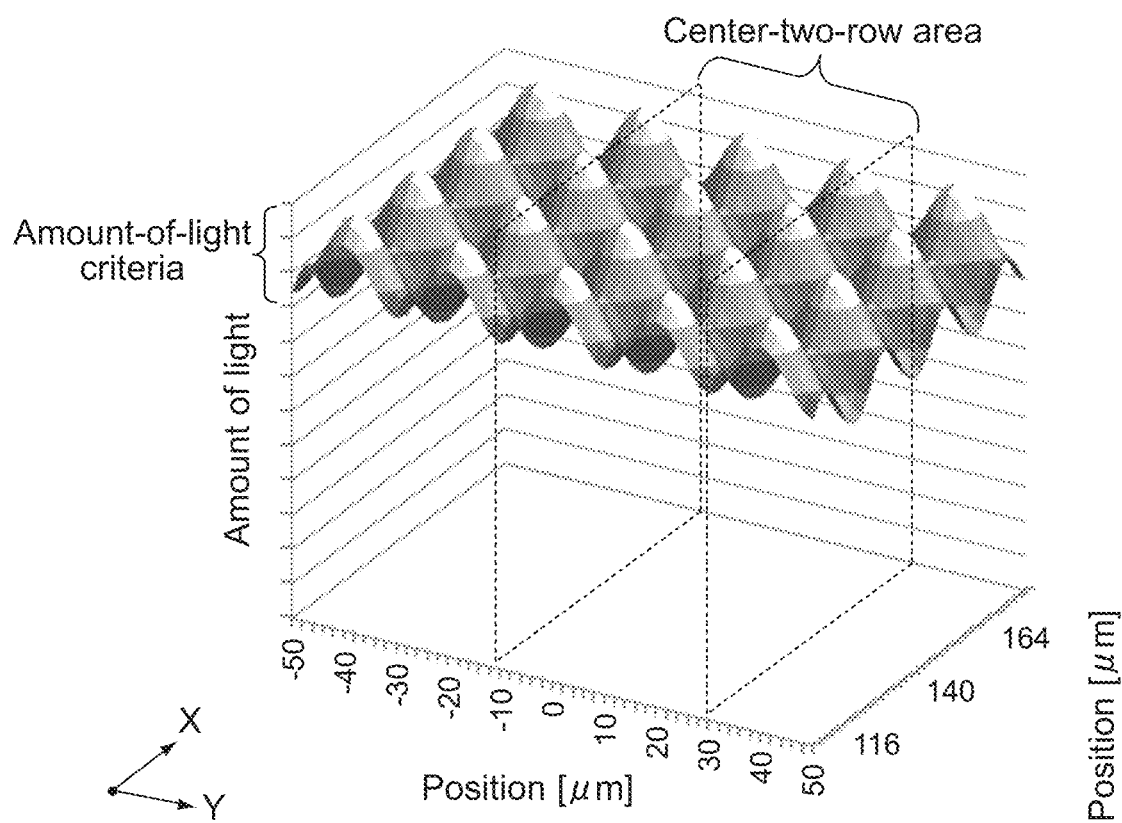
FIG. 19 A diagram showing a first multiple-row amount-of-light profile.
Figure 20:
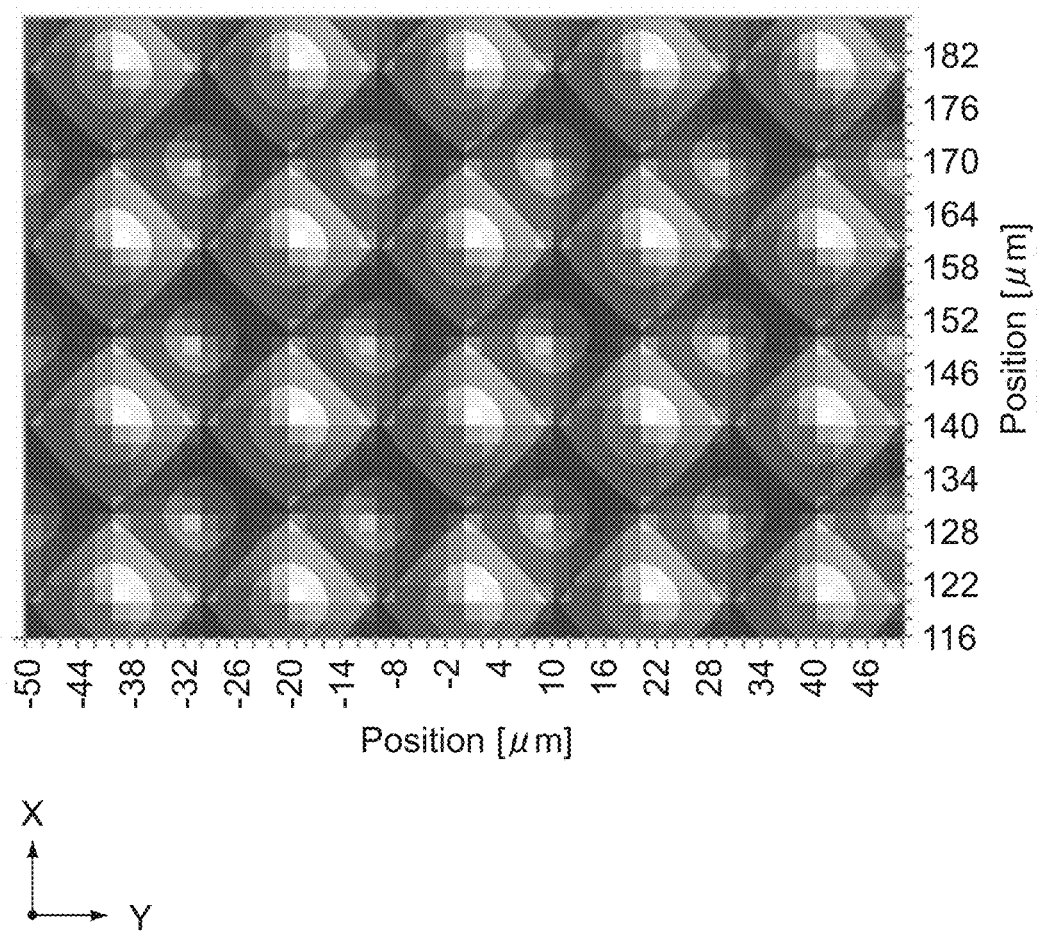
FIG. 20 A diagram showing the first multiple-row amount-of-light profile.

FIGS. 19 and 20 are diagrams each showing the first multiple-row amount-of-light profile. In generation of the first multiple-row amount-of-light profile, the control unit 11 first prepares five copies of the first amount-of-light profile (see FIG. 17) for one row which is generated in Step 209 (the row is in the X-axis direction). Then, the control unit 11 generates a first multiple-row amount-of-light profile by deviating these five copies in the Y-axis direction (scan direction of the light source unit 20) by each exposure pitch (Y-axis direction: 20 µm) and arranging the five copies.

It should be noted that although the number of rows in the first multiple-row amount-of-light profile is set to five in this embodiment, this value can be modified as appropriate (the same applies to a second multiple-row amount-of-light profile to be described later).

Next, the control unit 11 determines whether an amount of light of a center-two-row area (see FIG. 19) satisfies a first criteria in the first multiple-row amount-of-light profile (Step 219). In a case where the amount of light of the center-two-row area does not satisfy the first criteria (NO in Step 219), the control unit 11 corrects the amount of light of each laser element 51 such that the amount of light of the center-two-row area can satisfy the first criteria (Step 220).

At this time, for example, in a case where the laser element 51 having a smaller amount of light (not satisfying the first criteria) is present, the control unit 11 performs processing for increasing the amount of light corresponding to that laser element 51. Further, for example, the control unit 11 performs processing for reducing the amount of light corresponding to that laser element 51 in a case where the laser element 51 having a larger amount of light (not satisfying the first criteria) is present.

After correcting the amount of light of each laser element 51, the control unit 11 returns to Step 201 and executes the processing following Step 201 again.

In Step 219, in a case where the amount of light of the center-two-row area satisfies the first criteria (YES in Step 219), the control unit 11 generates a second multiple-row amount-of-light profile on the basis of the second amount-of-light profile (Step 221).

At this time, the control unit 11 prepares five copies of the second amount-of-light profile for one row which is generated in Step 217. The control unit 11 generates the second multiple-row amount-of-light profile by deviating these five copies in the Y-axis direction by each exposure pitch (20 µm) and arranging the five copies.

Next, the control unit 11 determines whether an amount of light of a center-two-row area (see FIG. 19) satisfies a second criteria in the second multiple-row amount-of-light profile (Step 222). In a case where the amount of light of the center-two-row area does not satisfy the second criteria (NO in Step 222), the control unit 11 corrects the amount of light of each laser element 51 such that the amount of light of the center-two-row area can satisfy the second criteria (Step 223).

At this time, for example, in a case where the laser element 51 having a smaller amount of light (not satisfying the second criteria) is present, the control unit 11 performs processing for increasing the amount of light corresponding to that laser element 51. Further, for example, in a case where the laser element 51 having a larger amount of light (not satisfying the second criteria) is present, the control unit 11 performs processing for reducing the amount of light corresponding to that laser element 51.

After correcting the amount of light of each laser element 51, the control unit 11 returns to Step 201 and executes the processing following Step 201 again.

In Step 222, in a case where the amount of light of the center-two-row area satisfies the second criteria (YES in Step 222), the control unit 11 terminates the processing.

(Modeling Data Correction)

Figure 21:
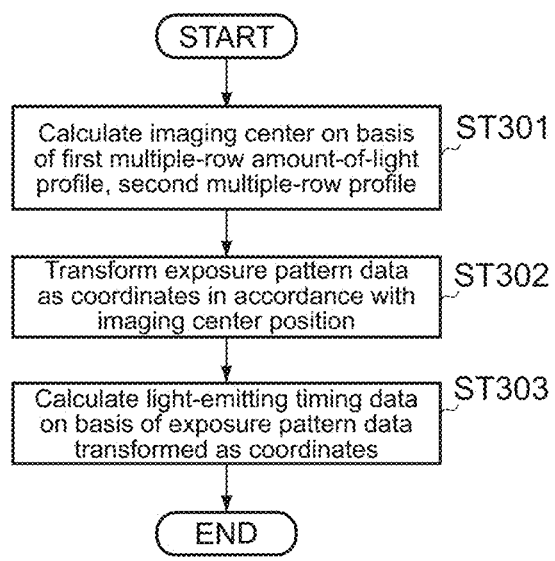
FIG. 21 A flowchart showing processing when correcting modeling data.

Next, the processing when correcting the modeling data will be described. FIG. 21 is a flowchart showing processing when correcting the modeling data.

First of all, the control unit 11 determines a position (dot center) of the imaging center of each laser element 51 on the basis of the first multiple-row amount-of-light profile determined to satisfy the first criteria, the second multiple-row amount-of-light profile determined to satisfy the second criteria (Step 301).

Next, the control unit 11 transforms the exposure pattern data in the modeling data as coordinates in accordance with the determined position of the imaging center (Step 302). Next, the control unit 11 calculates light-emitting timing data on the basis of the exposure pattern data transformed as the coordinates.

Figure 22:
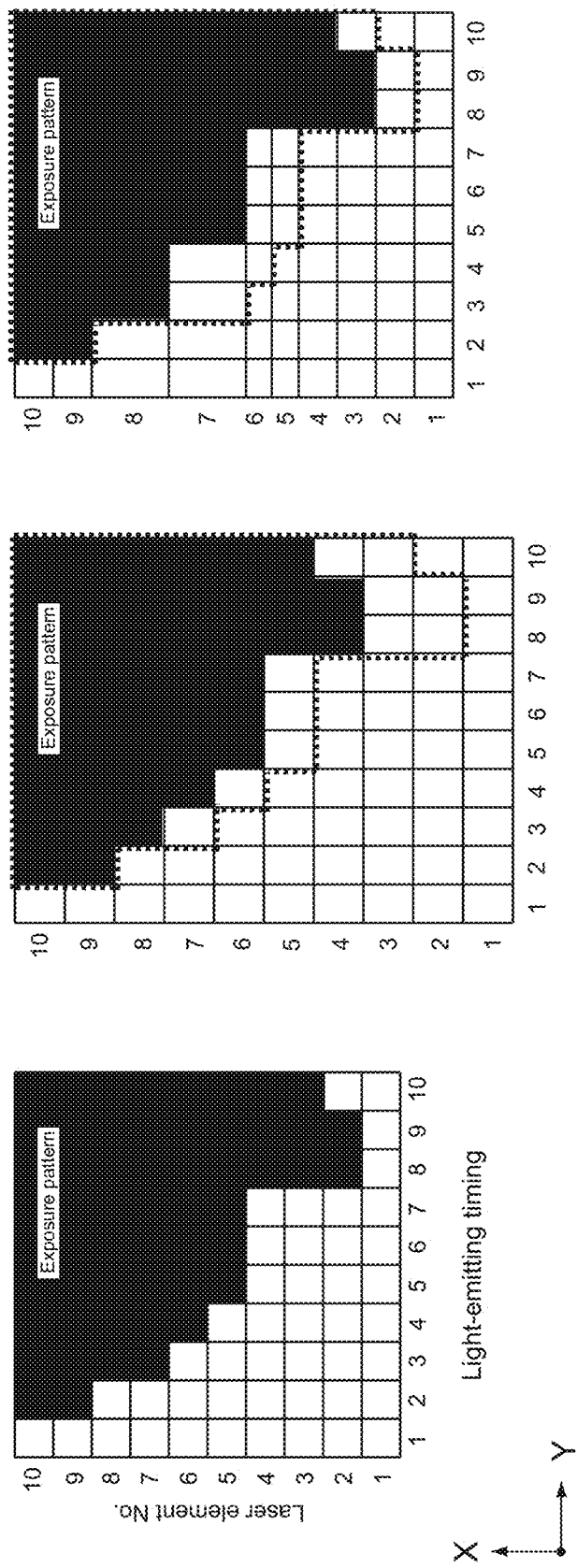
FIG. 22 A diagram for describing the processing when correcting the modeling data.

FIG. 22 is a diagram for describing the processing when correcting the modeling data.

An example of a case where the positions of the imaging centers of the ten laser elements 51 (Nos. 1 to 10) have no deviations is shown in the left diagram in FIG. 22. When the ten laser elements 51 are caused to emit light at a predetermined light-emitting timing while the ten laser elements 51 are moved in the scan direction (Y-axis direction), exposure according to the exposure pattern (region painted in black) as shown in the left diagram in FIG. 22 is performed.

That is, in a case where the imaging positions of the ten laser elements 51 have no deviations, accurate exposure according to a desired exposure pattern can be performed. It should be noted that the exposure pattern shown in the left diagram in FIG. 22 will be referred to as a reference exposure pattern hereinafter.

An example of a case where the distance between the positions of the imaging centers of the ten laser elements 51 (Nos. 1 to 10) are equally extended in the X-axis direction is shown in the center diagram of FIG. 22. As described above, it is assumed that the respective laser elements 51 are caused to emit light at the same light-emitting timing as the left diagram in a case where the imaging centers of the respective laser elements 51 are deviated. In this case, the exposure pattern is the region surrounded with the broken lines in the center diagram and is deviated from a desired reference exposure pattern (left diagram). In this case, the object to be modeled 2 cannot be accurately formed.

Therefore, in such a case, the control unit 11 transforms the exposure pattern as the coordinates by determining an exposure pattern (region painted in black) closest to the reference exposure pattern in a state in which the imaging centers of the respective laser elements 51 are deviated from each other (see Step 302). Then, the control unit 11 determines a light-emitting timing of each laser element 51 on the basis of the exposure pattern transformed as the coordinates (Step 303).

An example in a case where the positions of the imaging centers of the ten laser elements 51 (Nos. 1 to 10) are farther from each another in the X-axis direction or are closer to each other in the X-axis direction is shown in the right diagram of FIG. 22. Also in this case, when the respective laser elements 51 are caused to emit light at the same light-emitting timing as the left diagram, the exposure pattern is the region surrounded with the broken lines in the right diagram and is deviated from a desired reference exposure pattern (left diagram).

Therefore, also in this case, the control unit 11 transforms the exposure pattern as the coordinates by determining an exposure pattern (region painted in black) closest to the reference exposure pattern in a state in which the imaging centers of the respective laser elements 51 are deviated from each other (see Step 302). Then, the control unit 11 determines a light-emitting timing of each laser element 51 on the basis of the exposure pattern transformed as the coordinates (Step 303).

It should be noted that although in this description, the case where the imaging centers are deviated in the X-axis direction (direction of arrangement of the laser elements 51) has been shown, a case where the imaging centers are deviated in the Y-axis direction (scan direction of the light source unit 20) is also coped with in this embodiment. It is because the amount-of-light profile (multiple-row amount-of-light profile) is two-dimensionally generated corresponding not only to the X-axis direction but also to the Y-axis direction.

(Reason Why Two Amount-of-Light Profiles Are Used)

Next, the reason why the two amount-of-light profiles acquired in the state in which the distance l is different in a direction of depth with respect to the light source unit 20 are used in correction of the amount of light of the laser element 51 and correction of the modeling data will be described.

Figure 23:
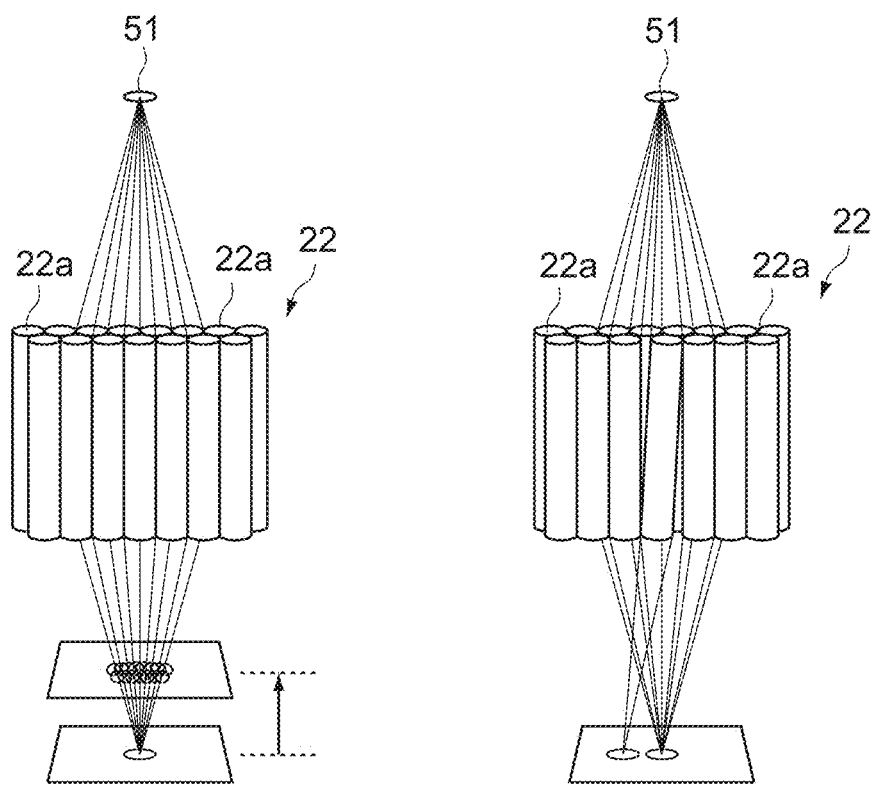
FIG. 23 A diagram for describing the reason why two amount-of-light profiles are used.

FIG. 23 is a diagram for describing the reason why the two amount-of-light profiles acquired in the state in which the distance l is different in the direction of depth with respect to the light source unit 20 are used in correction of the amount of light of the laser element 51 and correction of the modeling data.

An example of a case where the convergent rod lens 22 is normal is shown in the left diagram of FIG. 23. An example of a case where some rod lenses 22a of the convergent rod lens 22 are tilted is shown in the right diagram of FIG. 23.

As shown in FIG. 23, light emitted from the laser elements 51 is concentrated via the plurality of rod lenses 22a. Therefore, if the surface (image plane) of the photo-curing resin 1 is present at the position deviated from the focal point position in the direction of depth as shown in the left figure of FIG. 23, images are blurred and further the images are separated. Further, the images are separated if some lenses of the plurality of lenses are tilted even in a case where the surface of the photo-curing resin 1 is present at the position corresponding to the focal point position as shown in the right figure of FIG. 23.

The degree of separation of the images depends on the amount of deviation of the position of the surface of the photo-curing resin 1 from the focal point position. Further, exposure of the photo-curing resin 1 to light in the stereolithography apparatus 100 is affected not only by the amount of light on the surface of the photo-curing resin 1 but also by an amount of light at a position deeper with respect to the surface of the photo-curing resin 1.

Therefore, in this embodiment, two amount-of-light profiles of the first amount-of-light profile (first multiple-row amount-of-light profile) and the second amount-of-light profile (second multiple-row amount-of-light profile) acquired in a state in which the distance in the direction of depth with respect to the light source unit 20 is different are generated. Then, correction of the amount of light of the laser element 51 and correction of the modeling data are performed on the basis of these two amount-of-light profiles.

<Actions, etc.>

As described above, in this embodiment, the light-emitting module 30 is configured such that a plurality of (512) multi-laser chips 50 each including a plurality of (32) laser elements 51 arranged to be spaced apart from each other by a predetermined distance (20 μm) in the X-axis direction is arranged in the X-axis direction.

Accordingly, in this embodiment, the total number of laser elements 51 in the light-emitting module 30 can be increased (e.g., 50 or more). Therefore, high-speed modeling can be achieved even with an object to be modeled 2 having a larger width (in the X-axis direction).

Further, in this embodiment, the multi-laser chip 50 includes the first laser element 51a located at an outermost end in the X-axis direction in the multi-laser chip 50 and the second laser element 51b located at a second-outermost end in the X-axis direction. Then, the first individual electrodes 54a that supply the first laser elements 51a with electric power and the second individual electrodes 54b that supply the second laser elements 51b with electric power are arranged in the region between the first laser element 51a and the second laser element 51b in the lower surface of the multi-laser chip 50.

By arranging the individual electrodes 54 in such an array, the distance between the first laser element 51a in the one multi-laser chip 50 of the two multi-laser chips 50 adjacent to each other and the first laser element 51a in the other multi-laser chip 50 can be set to be equal to the distance between the laser elements 51 (20 μm: hereinafter, simply referred to as the distance between the laser elements 51) in the same multi-laser chip 50 (see FIGS. 7 and 10).

Therefore, in this embodiment, the object to be modeled 2 can be accurately formed in comparison with a case where the distance between the first laser elements 51a in the two multi-laser chips 50 adjacent to each other is different from the distance between the laser elements 51.

In particular, in this embodiment, even if the distance between the laser elements 51 is set to 100 μm or less that is a short distance, the distance between the first laser elements 51a in the two multi-laser chips 50 adjacent to each other can be set to be equal to the distance between the laser elements 51 (20 μm).

Further, in this embodiment, also regarding the individual electrodes 54 corresponding to the laser elements 51 other than the first laser elements 51a and the second laser elements 51b, an array similar to such an array is employed. That is, the two individual electrodes 54 that respectively supply the two laser elements 51 adjacent to each other with electric power are arranged in the region between the two laser elements 51 adjacent to each other in the laser elements 51 other than the first laser elements 51a and the second laser elements 51b.

Accordingly, for example, even in a case where the multi-laser chip 50 is configured by cutting out from a single wafer, the same multi-laser chip 50 can be formed irrespective of where the wafer is cut.

Further, in this embodiment, the light-emitting module 30 includes a plurality of (512) sub-mounts 40 arranged in the X-axis direction. One multi-laser chip 50 is mounted on each of the plurality of (512) sub-mounts 40. Further, the light-emitting module 30 includes a plurality of (16) driver ICs 31 arranged in the X-axis direction. A plurality of (32) sub-mounts 40 is mounted on each of the plurality of (16) driver ICs 31.

Then, in this embodiment, the distance between the first laser element 51a of the one multi-laser chip 50 of the two multi-laser chips 50 adjacent to each other and the first laser element 51a of the other multi-laser chip 50 is set to be equal to the distance (20 µm) between the laser elements 51 on the same driver IC 31 (see the left-hand side of FIG. 7).

In addition, in this embodiment, the distance between the first laser element 51a in the multi-laser chip 50 on the sub-mount 40 located at the outermost end in the one driver IC 31 of the two driver ICs 31 adjacent to each other and the first laser element 51a in the multi-laser chip 50 on the sub-mount 40 located at the outermost end in the other driver IC 31 is set to be equal to the distance between the laser elements 51 (20 µm) (see the right-hand side of FIG. 7).

Accordingly, the distance between all (16384) laser elements 51 in the light-emitting module 30 can be set to be an equal distance.

Further, in this embodiment, the sub-mount 40 includes a switching circuit for individually switching the respective laser elements 51 of the multi-laser chip 50 mounted thereon and causing the respective laser elements 51 to emit light.

Here, in a case where the size and the distance of the individual electrode 54 of the multi-laser chip 50 are configured to be small as in this embodiment, there is a problem in that it is difficult to test light emission of each laser element 51 through a prober. In view of this, in this embodiment, as described above, the switching circuit for individually switching the respective laser elements 51 and causing the respective laser elements 51 to emit light is mounted on the sub-mounts 40. Accordingly, light emission of the laser elements 51 can be individually tested by control to supply electric power to the input electrode pads 42 in the sub-mounts 40 through the prober.

Further, in this embodiment, the driver IC 31 includes therein the driving circuits for driving the respective laser elements 51 (light-emitting element) of the multi-laser chips 50 on the plurality of sub-mounts 40 mounted thereon. Accordingly, control of light emission of the laser elements 51 can be shared for each driver IC 31.

Further, in this embodiment, the distance between the laser elements 51 adjacent to each other is set to satisfy the relationship of P2≥0.5×P1. As described above, P1 is light density at imaging centers respectively corresponding to light beams emitted from the respective laser elements 51. On the other hand, P2 is light density at a middle position between the two imaging centers adjacent to each other. Accordingly, the respective dots due to exposure to light can be suitably overlap each other in the X-axis direction.

Further, in this embodiment, the light-emitting module (driver IC 31) is mounted on the heat transfer plate 25. Then, the light-emitting module 30 mounted on this heat transfer is arranged inside the casing 21 of the light source unit 20 and this casing 21 is provided with the cooling mechanism 80. Accordingly, heat due to the light-emitting module 30 can be suitably cooled.

It should be noted that in this embodiment, as described above, the number of laser elements 51 is large (16384) and the amount of heat generated by the light-emitting module 30 is also large, and thus it is particularly effective to cool heat due to the light-emitting module 30 through the above-mentioned cooling mechanism 80.

Further, in this embodiment, the photo-detector 60 detects light emitted from the light source unit 20. Then, the control unit 11 generates an amount-of-light profile on the basis of light detected by the photo-detector 60 and controls light emission of each laser element 51 on the basis of this amount-of-light profile.

In this manner, light emission of each laser element 51 can be accurately controlled by controlling light emission of each laser element 51 on the basis of the amount-of-light profile.

Further, in this embodiment, the amount of light of each laser element 51 is corrected on the basis of the amount-of-light profile. Accordingly, the amount of light of each laser element 51 can be adjusted to a suitable amount of light.

Further, in this embodiment, the light-emitting timing of each laser element 51 is corrected on the basis of the amount-of-light profile. Accordingly, the object to be modeled 2 can be accurately formed also in a case where the position of the imaging center of each laser element 51 is deviated due to the position deviation or the like of the laser elements 51 along with an increase in temperature of the light-emitting module 30, for example.

Further, in this embodiment, the two amount-of-light profiles of the first amount-of-light profile and the second amount-of-light profile acquired in a state in which the distance l between the light source unit 20 and the photo-detector 60 is different are generated. Then, correction of the amount of light of the laser element 51 and correction of the light-emitting timing are performed on the basis of these two amount-of-light profiles.

Accordingly, each type of correction can be performed on the basis of a plurality of amount-of-light profiles based on amounts of light in various depth positions. Therefore, each type of correction can be accurately performed.

Further, in this embodiment, a two-dimensional amount-of-light profile (multiple-row amount-of-light profile) indicating a two-dimensional amount-of-light distribution of light is generated as the amount-of-light profile. Then, correction of the amount of light of the laser element 51 and correction of the light-emitting timing are performed on the basis of the two-dimensional amount-of-light profile. Accordingly, each type of correction can be more accurately performed.

In addition, in this embodiment, assuming that the distance between the light source unit 20 and the photo-curing resin 1 is the distance L, the distance between the light source unit 20 and the photo-detector 60 is the distance l, and the depth of exposure of the photo-curing resin 1 by the light source unit 20 is D, the photo-detector 60 is arranged to satisfy the condition of L≤l≤L+D. Accordingly, the photo-detector 60 can be arranged at a suitable position for measuring an amount of light.

Second Embodiment

Next, a second embodiment of the present technology will be described. In the second embodiment, a light-emitting module 130 in the light source unit 20 has a configuration different from that of the above-mentioned first embodiment. Therefore, this point will be mainly described. It should be noted that the second embodiment in the following description, members having configurations and functions similar to those of the first embodiment will be denoted by identical reference signs and descriptions will be omitted or simplified.

Figure 24:
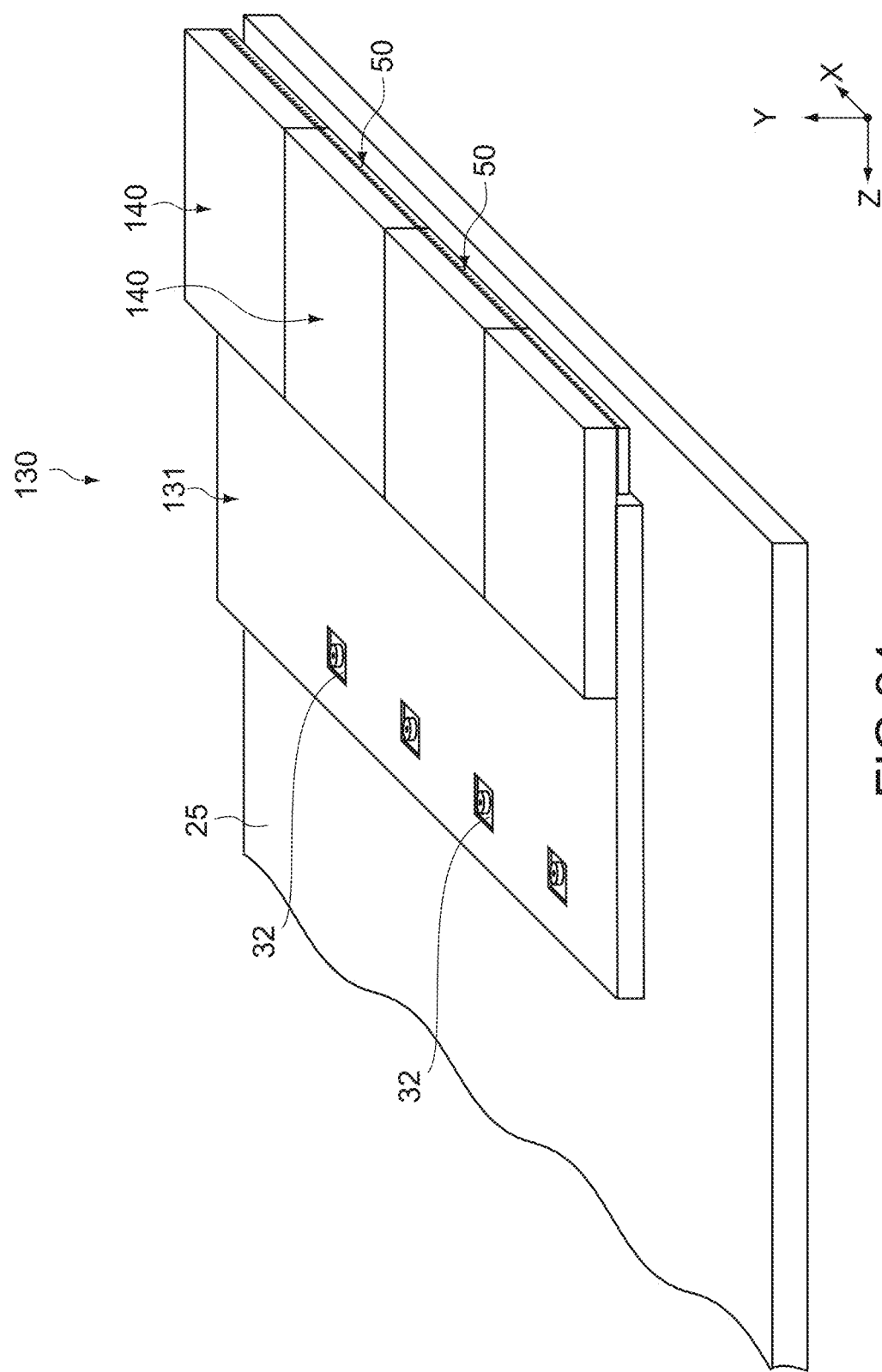
FIG. 24 A perspective view showing a light-emitting module according to a second embodiment.
Figure 25:
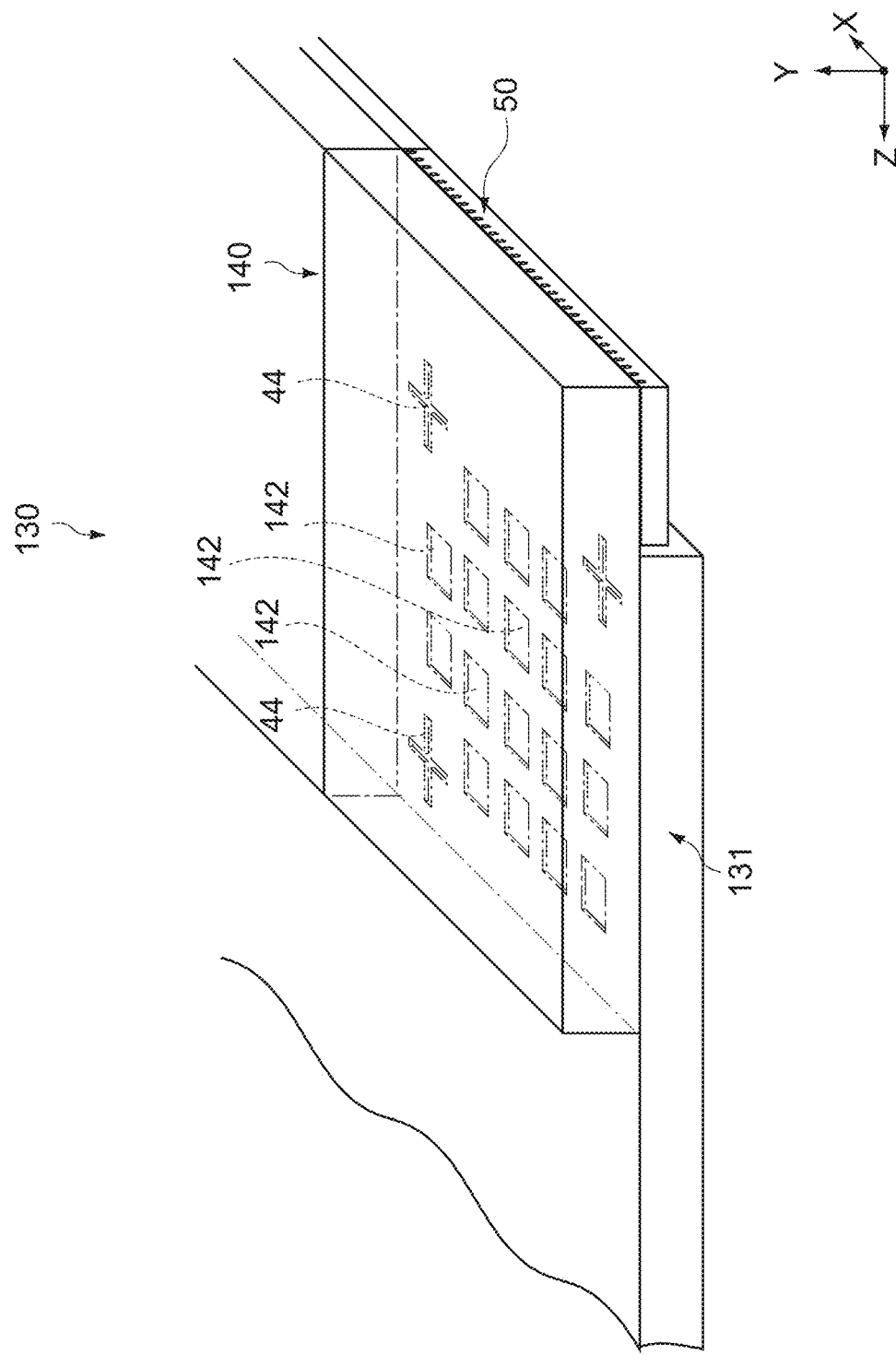
FIG. 25 An enlarged perspective view showing a part of a light-emitting module.
Figure 26:
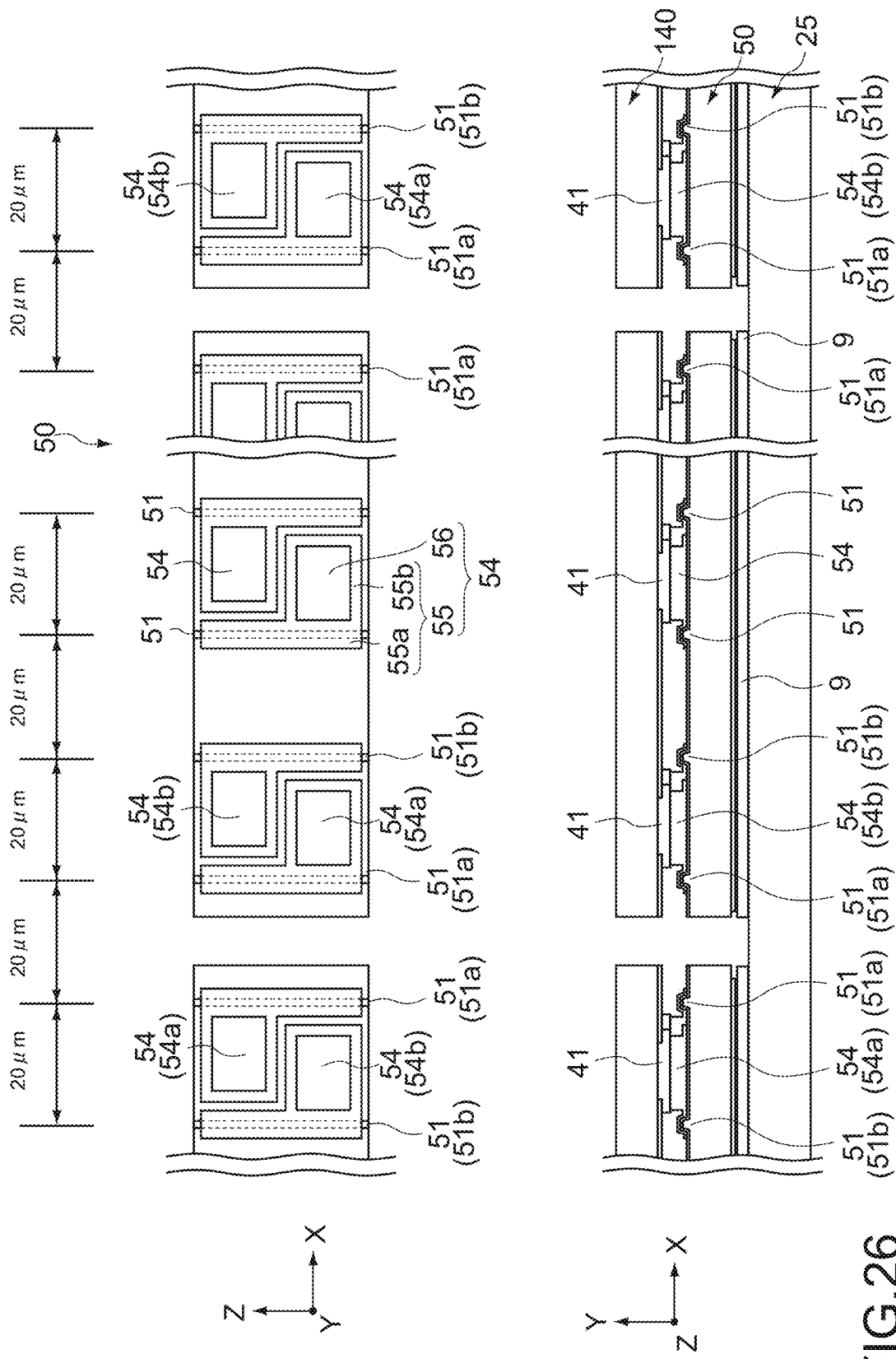
FIG. 26 A bottom view of multi-laser chips in the light-emitting module and a side view of the light-emitting module as viewed from a light-emitting side.

FIG. 24 is a perspective view showing the light-emitting module 130 according to the second embodiment. FIG. 25 is an enlarged perspective view showing a part of the light-emitting module 130. FIG. 26 is a bottom view of the multi-laser chip 50 in the light-emitting module 130 and is a side view of the light-emitting module 130 as viewed from the light-emitting side.

The second embodiment is different from the first embodiment mainly in that the multi-laser chips 50 are arranged on a lower side, not on an upper side of sub-mounts 140, and the sub-mounts 140 are mounted on driver ICs 131 by flip-chip mounting, not by wire bonding.

As shown in FIGS. 24 to 26, the light-emitting module 130 according to the second embodiment includes, as in the first embodiment, a plurality of driver ICs 131, a plurality of sub-mounts 140 mounted on the driver ICs 131, and multi-laser chips 50 mounted on the sub-mounts 140.

The sub-mount 140 includes, on the lower surface side, a plurality of input electrode pads 142 (FIG. 25), a plurality of alignment marks 44 (FIG. 25), and a plurality of bonding pads (lower diagram of FIG. 26). Further, the driver IC 131 includes, on the upper surface side, a plurality of output electrode pads (not shown) electrically connected to the plurality of input electrode pads 142 of the sub-mounts 40.

In the second embodiment, the number of input electrode pads 142 of the sub-mounts 140 is set to 17 and the size of the input electrode pad 142 is set to 50 μm×50 μm. For example, three of the 17 input electrode pads 142 are used for power supply, three of them are used for first GND, one of them is used for second GND, one of them is used for switching pulse input, and other nine of them are used as dummies.

The multi-laser chip 50 is arranged such that the side on which the individual electrode 54 is provided is the upper side and the side on which the common electrode 52 is provided is the lower side. In the second embodiment, the multi-laser chip 50 is arranged on the lower side of the sub-mount 40, and thus the multi-laser chip 50 is adjacent to the heat transfer plate 25.

In the second embodiment, in this manner, the multi-laser chip 50 is adjacent to the heat transfer plate 25, and thus the cooling performance of the multi-laser chip 50 can be enhanced. Further, in the second embodiment, for example, the adhesive 9 having high thermal conductivity is interposed between the multi-laser chip 50 and the heat transfer plate 25 (in the lower diagram of FIG. 26). Accordingly, the cooling performance of the multi-laser chip 50 can be further enhanced.

Various Modified Examples

Figure 27:
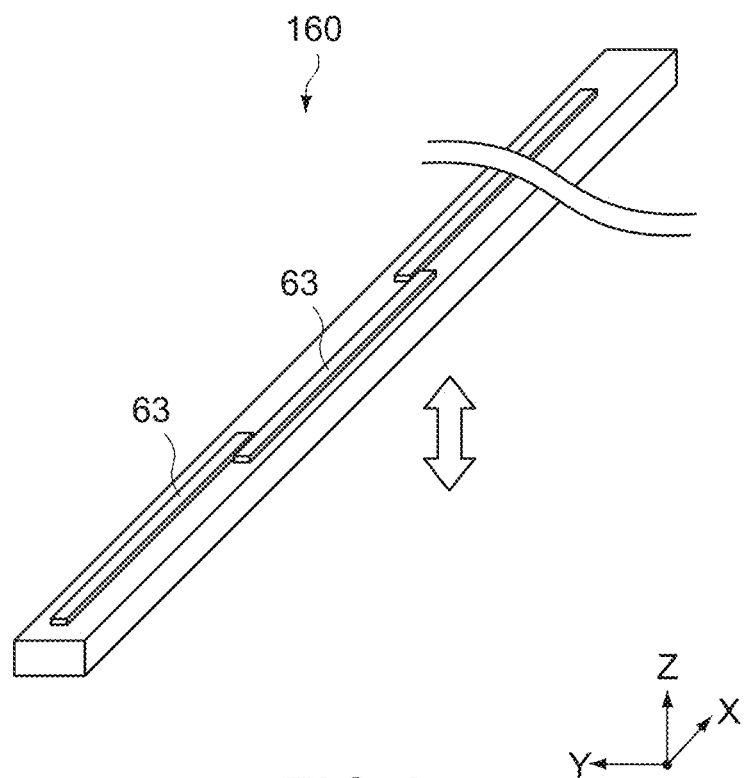
FIG. 27 A diagram showing another example of the photo-detector.

FIG. 27 is a diagram showing another example of the photo-detector. In the example shown in FIG. 27, the number of photo-detectors 160 is set to one and this photo-detector 160 is moved in the upper and lower directions through the moving mechanism. The moving mechanism moves the photo-detector 160 in the upper and lower directions such that the distance l between the light source unit 20 and the photo-detector 160 becomes different. Also with such a configuration, the photo-detector 160 is capable of detecting light in the state in which the distance l is different.

It should be noted that the light source unit 20 may be moved in the upper and lower directions by the moving mechanism, not the photo-detector 160. Further, both of the photo-detector 160 and the light source unit 20 may be moved in the upper and lower directions.

Figure 28:
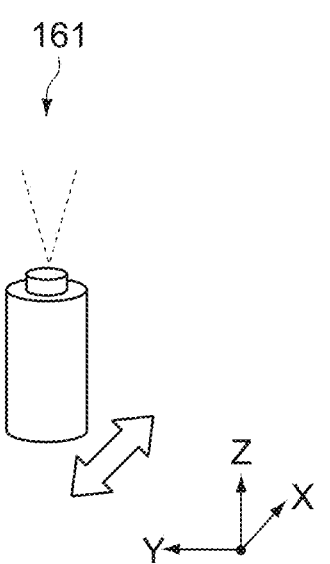
FIG. 28 A diagram showing still another example of the photo-detector.

FIG. 28 is a diagram showing still another example of the photo-detector. In the example shown in FIG. 28, a camera 161 is moved by the moving mechanism in the X-axis direction (direction of arrangement of the laser elements 51). In the camera, the number of pixels is set to 640×480 and the resolution at the focal point position is set to 4 μm, for example.

It should be noted that a plurality of (e.g., two) cameras 161 each located at the distance l may be provided such that the cameras 161 are capable of detecting light in the state in which the distance l is different. Further, the single camera 161 may be moved in the upper and lower directions by the moving mechanism. Alternatively, the light source unit 20, not the camera 161 may be moved by the moving mechanism in the upper and lower directions or both of the camera 161 and the light source unit 20 may be moved in the upper and lower directions by the moving mechanism.

Figure 29:
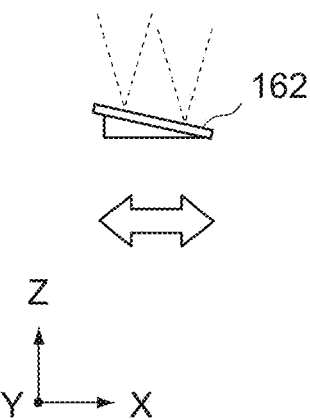
FIG. 29 A diagram showing a state when an image plane of an image pickup element of a camera in an X-axis direction is tilted.

In addition, the image plane in an image pickup element 162 of the camera 161 may be tilted with respect to the X-axis direction (direction of arrangement of the laser elements 51) (in this case, the moving mechanism in the upper and lower directions is not required) such that the camera 161 is capable of detecting light in the state in which the distance l is different. FIG. 29 is a diagram showing a state when the image plane of the image pickup element 162 of the camera is tilted with respect to the X-axis direction (direction of arrangement of the laser elements 51).

Figure 30:
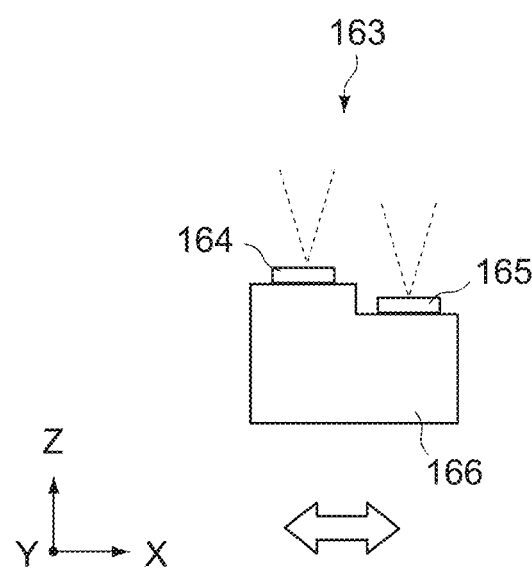
FIG. 30 A diagram showing still another example of the photo-detector.

FIG. 30 is a diagram showing still another example of the photo-detector. This photo-detector 163 includes a first image pickup element 164 and a second image pickup element 165. The first image pickup element 164 and the second image pickup element 165 are arranged different height positions on a support table 166 such that the distance l from the light source unit 20 becomes different.

Further, the first image pickup element 164 and the second image pickup element 165 are moved in the X-axis direction (direction of arrangement of the laser elements 51) together with the support table 166 through the moving mechanism. Regarding each of the first image pickup element 164 and the second image pickup element 165, for example, the number of pixels is set to 640×480 and the resolution at the focal point position is set to 4 μm.

Also with such a configuration, the photo-detector 163 is set to be capable of detecting light in the state in which the distance l is different. It should be noted that the number of image pickup elements may be one or may be three or more.

Further, one image pickup element may be moved in the upper and lower directions by the moving mechanism such that the image pickup element is capable of detecting light in the state in which the distance l is different. Further, the light source unit 20, not the image pickup element may be moved in the upper and lower directions by the moving mechanism or both of the image pickup element and the light source unit 20 may be moved in the upper and lower directions by the moving mechanism.

In addition, the image plane in the image pickup element may be tilted with respect to the X-axis direction (direction of arrangement of the laser elements 51) (in this case, the moving mechanism in the upper and lower directions is not required) such that the image pickup element is capable of detecting light in the state in which the distance l is different.

In the description above, when the object to be modeled 2 is formed, the case where the light source unit 20 is moved relative to the resin tank 5 has been described. On the other hand, when the object to be modeled 2 is formed, the resin tank 5 may be moved relative to the light source unit 20. Alternatively, both of the light source unit 20 and the resin tank 5 may be configured to be movable.

In the description above, the laser element 51 has been shown as an example of the light-emitting element. The light-emitting element may be another light-emitting element such as a light emitting diode (LED).

In the description above, the case where the amount-of-light profile is a two-dimensional amount-of-light profile has been described. On the other hand, the amount-of-light profile may be one dimensional amount-of-light profile (see the lower diagram of FIG. 11) in the X-axis direction (direction of arrangement of the laser elements 51).

In the description above, the case where the two amount-of-light profiles each located at the distance l different are used has been described. On the other hand, the amount-of-light profile may be one. Alternatively, three or more amount-of-light profiles each located at the distance l different may be used.

In the description above, the case where the light-emitting module 30 is applied to the stereolithography apparatus 100 has been described. On the other hand, the light-emitting module 30 according to the present technology can be applied to various apparatuses such as a laser printer, a laser display apparatus, and a measurement apparatus.

The server apparatus over the network may execute the above-mentioned processing of the control unit 11.

The present technology can also take the following configurations.

(1) A stereolithography apparatus, including:
a light source unit including a plurality of light-emitting elements that emits light for curing a photo-curing resin;
a photo-detector that detects the light emitted from the light source unit; and
a control unit that generates an amount-of-light profile indicating an amount-of-light distribution of the light on the basis of the light detected by the photo-detector and controls light emission of the plurality of light-emitting elements on the basis of the amount-of-light profile.

(2) The stereolithography apparatus according to (1), in which
the control unit corrects an amount of light of each of the plurality of light-emitting elements on the basis of the amount-of-light profile.

(3) The stereolithography apparatus according to (1) or (2), in which
the control unit corrects a light-emitting timing of each of the plurality of light-emitting elements on the basis of the amount-of-light profile.

(4) The stereolithography apparatus according to any one of (1) to (3), in which
a condition of L≤l≤L+D is satisfied assuming that a distance between the light source unit and the photo-curing resin is a distance L, a distance between the light source unit and the photo-detector is a distance l, and an exposure depth of the light source unit with respect to the photo-curing resin is D.

(5) The stereolithography apparatus according to any one of (1) to (4), in which
the photo-detector is capable of detecting the light in a state in which the distance l between the light source unit and the photo-detector is different.

(6) The stereolithography apparatus according to (5), in which the control unit
generates a first amount-of-light profile and a second amount-of-light profile on the basis of light respectively detected in the state in which the distance l is different, and
controls light emission of the plurality of light-emitting elements on the basis of the first amount-of-light profile and the second amount-of-light profile.

(7) The stereolithography apparatus according to (6), in which
the control unit corrects an amount of light of each of the plurality of light-emitting elements on the basis of the first amount-of-light profile and the second amount-of-light profile.

(8) The stereolithography apparatus according to (6) or (7), in which
the control unit corrects a light-emitting timing of each of the plurality of light-emitting elements on the basis of the first amount-of-light profile and the second amount-of-light profile.

(9) The stereolithography apparatus according to (5), in which
the photo-detector includes a first photo detector and a second photo detector each located at the distance l different.

(10) The stereolithography apparatus according to (5), further including
a moving mechanism that moves at least one of the light source unit or the photo-detector to make the distance l different.

(11) The stereolithography apparatus according to any one of (1) to (10), in which
the control unit generates, as the amount-of-light profile, a two-dimensional amount-of-light profile indicating a two-dimensional amount-of-light distribution of the light and controls light emission of the plurality of light-emitting elements on the basis of the two-dimensional amount-of-light profile.

(12) The stereolithography apparatus according to (11), in which
the control unit corrects an amount of light of each of the plurality of light-emitting elements on the basis of the two-dimensional amount-of-light profile.

(13) The stereolithography apparatus according to (11) or (12), in which
the control unit corrects a light-emitting timing of each of the plurality of light-emitting elements on the basis of the two-dimensional amount-of-light profile.

(14) A light emission control method, including:
detecting light emitted from a light source unit including a plurality of light-emitting elements that emits the light for curing a photo-curing resin;
generating an amount-of-light profile indicating an amount-of-light distribution of the light; and
controlling light emission of the plurality of light-emitting elements on the basis of the amount-of-light profile.

(15) A program that causes a computer to execute:
a step of detecting light emitted from a light source unit including a plurality of light-emitting elements that emits the light for curing a photo-curing resin;
a step of generating an amount-of-light profile indicating an amount-of-light distribution of the light; and
a step of controlling light emission of the plurality of light-emitting elements on the basis of the amount-of-light profile.

REFERENCE SIGNS LIST 1 photo-curing resin
2 object to be modeled
5 resin tank
11 control unit
20 light source unit
30 light-emitting module
22 convergent rod lens
31 driver IC 40 sub-mount
50 multi-laser chip
51 laser element
54 individual electrode
60 photo-detector
80 cooling mechanism
100 stereolithography apparatus

The invention claimed is:

1. A stereolithography apparatus, comprising:
a light source unit including a plurality of light-emitting elements, wherein the plurality of light-emitting elements is configured to emit light for curing a photo-curing resin;
a plurality of photo-detectors configured to detect the emitted light; and
a central processing unit (CPU) configured to:
generate a plurality of amount-of-light profiles based on the light detected by the plurality of photo-detectors, wherein each amount-of-light profile of the plurality of amount-of-light profiles indicates an amount-of-light distribution of the emitted light; and
control light emission of the plurality of light-emitting elements based on the generated plurality of amount-of-light profiles, wherein
the plurality of photo-detectors includes a first photo-detector and a second photo-detector,
a first distance from the light source unit to the first photo-detector is different from a second distance from the light source unit to the second photo-detector, and
the first photo-detector and the second photo-detector are configured to detect the light emitted from the plurality of light-emitting elements at the first distance from the light source unit and the second distance from the light source unit, respectively.

2. The stereolithography apparatus according to claim 1, wherein the CPU is further configured to correct an amount of the light emitted by each light-emitting element of the plurality of light-emitting elements based on the plurality of amount-of-light profiles.

3. The stereolithography apparatus according to claim 1, wherein the CPU is further configured to correct a light-emitting timing of each light-emitting element of the plurality of light-emitting elements based on the plurality of amount-of-light profiles.

4. The stereolithography apparatus according to claim 1, wherein
a condition of $L \leq l \leq L+D$ is satisfied,
a distance between the light source unit and the photo-curing resin is a distance L,
one of the first distance or the second distance is a distance l, and
an exposure depth of the light source unit with respect to the photo-curing resin is D.

5. The stereolithography apparatus according to claim 1, wherein the CPU is further configured to:
generate a first amount-of-light profile based on the light detected by the first photo-detector;
generate a second amount-of-light profile based on the light detected by the second photo-detector, wherein the plurality of amount-of-light profiles includes the first amount-of-light profile and the second amount-of-light profile; and
control the light emission of the plurality of light-emitting elements based on the first amount-of-light profile and the second amount-of-light profile.

6. The stereolithography apparatus according to claim 5, wherein the CPU is further configured to correct an amount of the light emitted by each light-emitting element of the plurality of light-emitting elements based on the first amount-of-light profile and the second amount-of-light profile.

7. The stereolithography apparatus according to claim 5, wherein the CPU is further configured to correct a light-emitting timing of each light-emitting element of the plurality of light-emitting elements based on the first amount-of-light profile and the second amount-of-light profile.

8. The stereolithography apparatus according to claim 1, wherein the CPU is further configured to control movement of at least one of the light source unit or the plurality of photo-detectors to change:
the first distance between the light source unit and the first photo-detector, and
the second distance between the light source unit and the second photo-detector.

9. The stereolithography apparatus according to claim 1, wherein the CPU is further configured to:
generate, as the plurality of amount-of-light profiles, a plurality of two-dimensional amount-of-light profiles, wherein each two-dimensional amount-of-light profile of the plurality of two-dimensional amount-of-light profiles indicates a two-dimensional amount-of-light distribution of the emitted light; and
control the light emission of the plurality of light-emitting elements based on the plurality of two-dimensional amount-of-light profiles.

10. The stereolithography apparatus according to claim 9, wherein the CPU is further configured to correct an amount of the light emitted by each light-emitting element of the plurality of light-emitting elements based on the plurality of two-dimensional amount-of-light profiles.

11. The stereolithography apparatus according to claim 9, wherein the CPU is further configured to correct a light-emitting timing of each light-emitting element of the plurality of light-emitting elements based on the plurality of two-dimensional amount-of-light profiles.

* * * * *